United States Patent
Wang et al.

(10) Patent No.: US 12,279,530 B2
(45) Date of Patent: Apr. 15, 2025

(54) AUGMENTED LOGARITHMIC SPIRAL ANTENNA STRUCTURE APPLIED TO ELECTROMAGNETIC WAVE ENERGY ABSORBER, THERMOELECTRIC ENERGY HARVESTER, PHOTOCONDUCTIVE ANTENNA, ARRAY ANTENNA AND RECTENNA

(71) Applicant: NATIONAL TSING HUA UNIVERSITY, Hsinchu (TW)

(72) Inventors: Wei-Chih Wang, Sammamish, WA (US); Prabir Garu, Hsinchu (TW); Fiona Marie Wang, Seattle, WA (US)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 141 days.

(21) Appl. No.: 18/096,968

(22) Filed: Jan. 13, 2023

(65) Prior Publication Data
US 2024/0244975 A1 Jul. 18, 2024

(51) Int. Cl.
*H01Q 1/36* (2006.01)
*H10N 10/17* (2023.01)

(52) U.S. Cl.
CPC ............ *H10N 10/17* (2023.02); *H01Q 1/36* (2013.01)

(58) Field of Classification Search
CPC ........... H01Q 1/36; H01Q 9/27; H01Q 11/083
See application file for complete search history.

(56) References Cited

U.S. PATENT DOCUMENTS

| | | |
|---|---|---|
| 2014/0300526 A1 | 10/2014 | Rahman et al. |
| 2014/0366927 A1 | 12/2014 | Lavrova et al. |
| 2015/0109177 A1 | 4/2015 | Lavin |
| 2022/0045430 A1 | 2/2022 | Martel et al. |

FOREIGN PATENT DOCUMENTS

WO 2020206372 A1 10/2020

*Primary Examiner* — Graham P Smith
(74) *Attorney, Agent, or Firm* — Joseph C. Zucchero; Carolyn S. Elmore; Elmore Patent Law Group, P.C.

(57) ABSTRACT

An augmented logarithmic spiral antenna structure includes a first conductive layer, a dielectric layer and a second conductive layer. The first conductive layer includes a first spiral arm and a plurality of second spiral arms. The first spiral arm includes a first initial radius. The second spiral arms are disposed around and connected to the first spiral arm, and each of the second spiral arms includes a second initial radius. The dielectric layer has a top surface and a bottom surface, and the top surface is connected to the first conductive layer. The second conductive layer is connected to the bottom surface. A plurality of the second initial radii of the second spiral arms are different from each other, and different from the first initial radius.

22 Claims, 25 Drawing Sheets
(4 of 25 Drawing Sheet(s) Filed in Color)

AUGMENTED LOGARITHMIC SPIRAL ANTENNA STRUCTURE APPLIED TO ELECTROMAGNETIC WAVE ENERGY ABSORBER, THERMOELECTRIC ENERGY HARVESTER, PHOTOCONDUCTIVE ANTENNA, ARRAY ANTENNA AND RECTENNA

BACKGROUND

Technical Field

The present disclosure relates to an augmented logarithmic spiral antenna structure, an electromagnetic wave energy absorber, a thermoelectric energy harvester, a photoconductive antenna, an array antenna and a rectenna. More particularly, the present disclosure relates to an augmented logarithmic spiral antenna structure that can enhance the absorption bandwidth and be applied to an electromagnetic wave energy absorber, a thermoelectric energy harvester, a photoconductive antenna, an array antenna and a rectenna.

Description of Related Art

The rising demand for direct electromagnetic (EM) energy harvesting from the environment has revolutionized lifestyle of today's society. Earth's long-wave infrared (LWIR) and sun are considered the most abundant energy sources of IR and visible band. Once capturing such energy and converting into direct current electrical form that can be used in many low power electronics applications. Therefore, it is necessary to develop broadband receiver antenna to collect the energy sources of IR and visible band efficiently for practical usage. One of the key components of such technology is a planar broadband antenna structure, which has the attractive characteristics, such as large operating bandwidth, low profile, light weight, low cost and ease of integration.

However, in order to achieve better performance of the absorber, not just broadband, high absorption often plays a major role. Therefore, to realize a high-performance antenna, both transmission and reflection should be minimized within the operating frequency range. In addition, the bandwidth enhancement of the antenna can be achieved at the cost of the large thickness and heavy weight, which is not suitable for some particular applications. Moreover, the conventional antennas suffer from unavoidable surface reflection at the interface of free space and the absorbing layer. Another bottleneck of broadband IR antennas is plasmonic characteristics of metal-based configurations deteriorate rapidly at long wavelengths. This behavior significantly limits the use of metal arrays as broadband IR light absorbers.

Typical broadband IR absorbers employ a sandwiched structure, consisting of an array of ultra-thin metallic pattern and a ground plane, separated by a dielectric spacer. Since ground layer blocks the transmission of incoming waves completely, once the impedance is matched between the absorber and the free space, perfect absorption can be realized. However, owing to the resonant nature of the structures, such EM absorbers suffer from a limited working bandwidth which seriously restricts their practical applications.

In view of the problems, how to establish the perfect broadband absorbers minimizing reflection and transmission and maximizing the absorption bandwidth in the broad frequency range are indeed highly anticipated by the public and become the goal and the direction of relevant industry efforts.

SUMMARY

According to one aspect of the present disclosure, an augmented logarithmic spiral antenna structure includes a first conductive layer, a dielectric layer and a second conductive layer. The first conductive layer includes a first spiral arm and a plurality of second spiral arms. The first spiral arm includes a first initial radius. The second spiral arms are disposed around and connected to the first spiral arm, and each of the second spiral arms includes a second initial radius. The dielectric layer has a top surface and a bottom surface, and the top surface is connected to the first conductive layer. The second conductive layer is connected to the bottom surface. A plurality of the second initial radii of the second spiral arms are different from each other, and different from the first initial radius.

According to another aspect of the present disclosure, an electromagnetic wave energy absorber includes a nanoantenna. The nanoantenna includes at least one augmented logarithmic spiral antenna structure of the aforementioned aspect. The nanoantenna is configured to absorb an incident radiation, and a frequency of the incident radiation is f, and the following condition is satisfied: 4.5 THz<f≤100 THz.

According to one another aspect of the present disclosure, an augmented logarithmic spiral antenna structure includes a first conductive layer, a dielectric layer and a second conductive layer. The first conductive layer has a first pattern, and includes a first spiral arm and a plurality of second spiral arms. The first spiral arm includes a first initial radius. The second spiral arms are disposed around and connected to the first spiral arm, and each of the second spiral arms includes a second initial radius. The dielectric layer is connected to the first conductive layer and has a second pattern, and the second pattern is the same as the first pattern. The second conductive layer is connected to the dielectric layer, and the dielectric layer is located between the first conductive layer and the second conductive layer. A plurality of the second initial radii of the second spiral arms are different from each other, and different from the first initial radius.

According to still another aspect of the present disclosure, an electromagnetic wave energy absorber includes a nanoantenna. The nanoantenna includes at least one augmented logarithmic spiral antenna structure of the aforementioned aspect. The nanoantenna is configured to absorb an incident radiation, and a frequency of the incident radiation is f, and the following condition is satisfied: 4.5 THz<f≤100 THz.

According to still another aspect of the present disclosure, a photoconductive antenna is configured to replace one of a spiral antenna and a bow tie antenna. The photoconductive antenna includes the first conductive layer of the augmented logarithmic spiral antenna structure of the aforementioned aspect, a photo-absorbing semiconductor layer and the second conductive layer of the augmented logarithmic spiral antenna structure of the aforementioned aspect. The photo-absorbing semiconductor layer is connected to the first conductive layer, and a structure of the photo-absorbing semiconductor layer is the same as a structure of the dielectric layer of the augmented logarithmic spiral antenna structure of the aforementioned aspect. The second conductive layer of the augmented logarithmic spiral antenna structure is connected to the photo-absorbing semiconductor layer, and the photo-absorbing semiconductor layer is located between the first conductive layer and the second conductive layer.

According to still another aspect of the present disclosure, an array antenna includes a plurality of the augmented logarithmic spiral antenna structures of the aforementioned aspect. A plurality of the first conductive layers of the augmented logarithmic spiral antenna structures are arranged at intervals. A plurality of the dielectric layers of the augmented logarithmic spiral antenna structures are arranged at intervals. A plurality of the second conductive layers of the augmented logarithmic spiral antenna structure are connected to each other or formed integrally.

According to still another aspect of the present disclosure, a rectenna is used for a communication or an energy harvesting device, and the rectenna includes the augmented logarithmic spiral antenna structure of the aforementioned aspect and a rectifier module. The augmented logarithmic spiral antenna structure receives a radio frequency signal or a radiation. The rectifier module is electrically connected to the augmented logarithmic spiral antenna structure and converts the radio frequency signal or the radiation from an alternating current into a direct current.

According to still another aspect of the present disclosure, a thermoelectric energy harvester includes a first conductive layer, a dielectric layer, a second conductive layer, a contact electrode and a coaxial cable. The first conductive layer has a first pattern and receives a heat radiation, and the first conductive layer includes a first spiral arm and a plurality of second spiral arms. The first spiral arm includes a first initial radius. The second spiral arms are disposed around and connected to the first spiral arm, and each of the second spiral arms includes a second initial radius. The dielectric layer is connected to the first conductive layer and has a second pattern, and the second pattern is the same as the first pattern. The second conductive layer is connected to the dielectric layer, and the dielectric layer is located between the first conductive layer and the second conductive layer. The contact electrode is disposed through the dielectric layer and electrically connected between the first conductive layer and the second conductive layer. The coaxial cable is electrically connected to the contact electrode and converts the heat radiation into a direct current according to a Seebeck effect. A plurality of the second initial radii of the second spiral arms are different from each other, and different from the first initial radius.

BRIEF DESCRIPTION OF THE DRAWINGS

The patent or application file contains at least one drawing executed in color. Copies of this patent or patent application publication with color drawing(s) will be provided by Office upon request and payment of the necessary fee. The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1A:
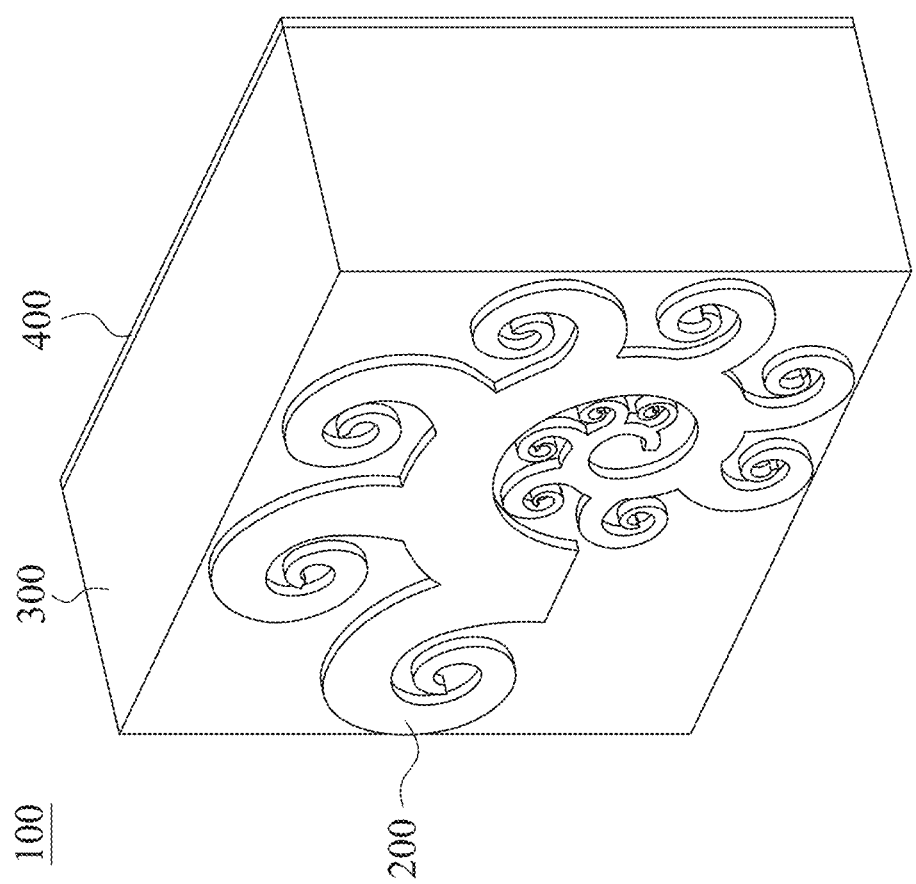
FIG. 1A shows a three-dimensional schematic view of an augmented logarithmic spiral antenna structure according to the first embodiment of the present disclosure.
Figure 1B:
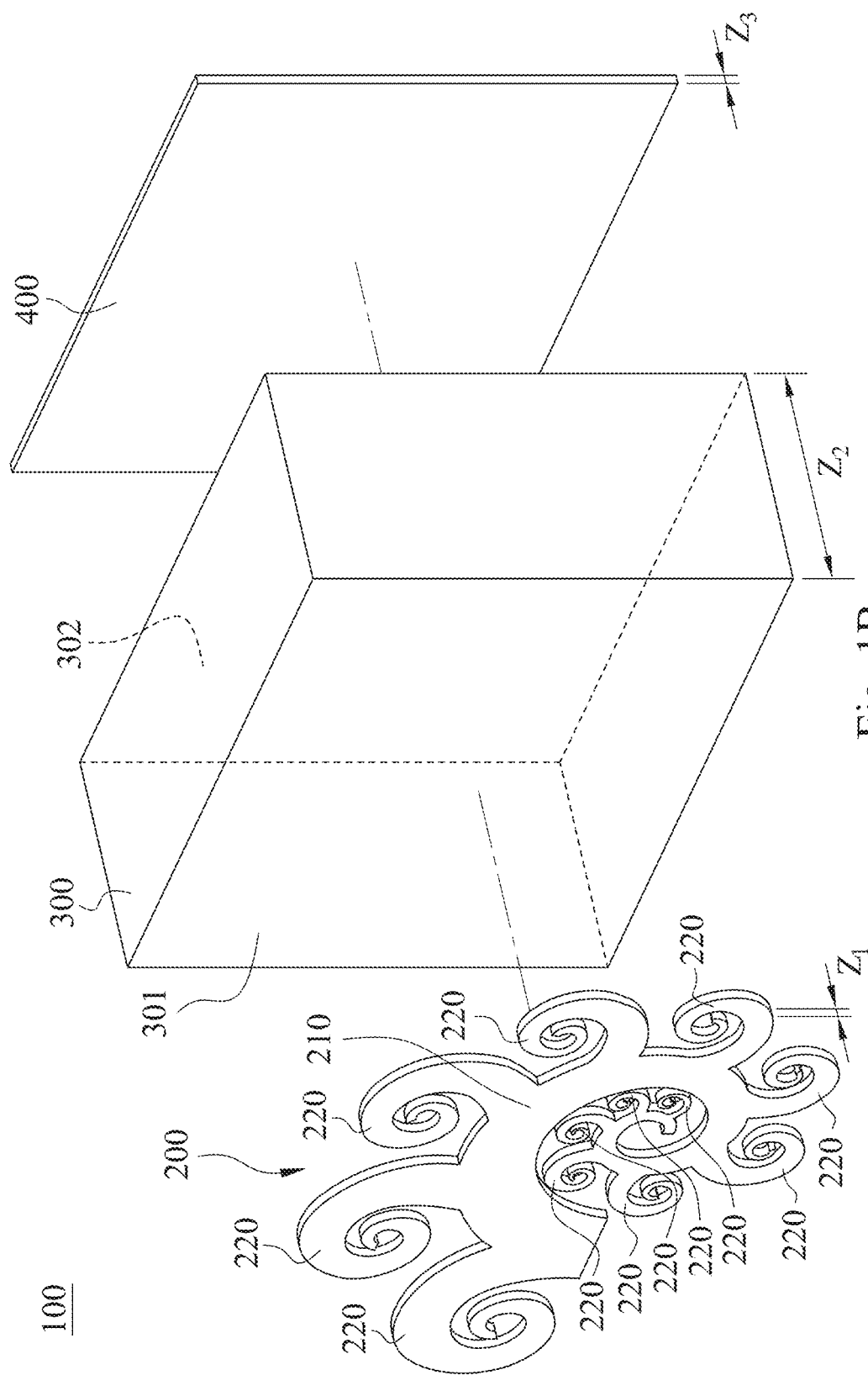
FIG. 1B shows an exploded view of the augmented logarithmic spiral antenna structure of FIG. 1A.
Figure 1C:
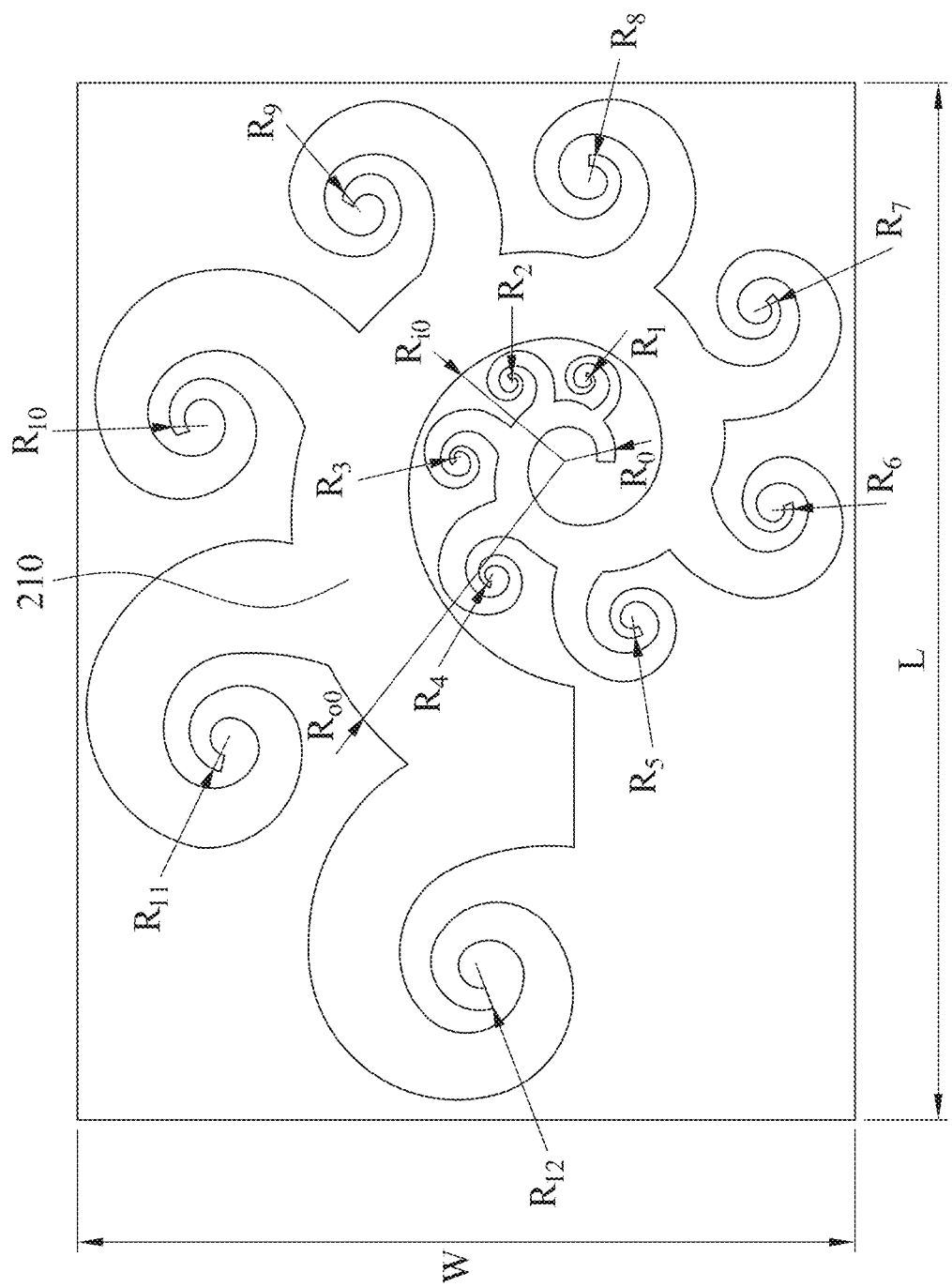
FIG. 1C shows a top view of the augmented logarithmic spiral antenna structure of FIG. 1A.

Please refer to FIG. 1A, FIG. 1B and FIG. 1C. FIG. 1A shows a three-dimensional schematic view of an augmented logarithmic spiral antenna structure 100 according to the first embodiment of the present disclosure. FIG. 1B shows an exploded view of the augmented logarithmic spiral antenna structure 100 of FIG. 1A. FIG. 1C shows a top view of the augmented logarithmic spiral antenna structure 100 of FIG. 1A. As shown in FIGS. 1A, 1B and 1C, the augmented logarithmic spiral antenna structure 100 includes a first conductive layer 200, a dielectric layer 300 and a second conductive layer 400.

The first conductive layer 200 includes a first spiral arm 210 and a plurality of second spiral arms 220. The first spiral arm 210 includes a first initial radius $R_0$ (as shown in FIG. 1C). The second spiral arms 220 are disposed around and connected to the first spiral arm 210, and the second spiral arms 220 includes a plurality of second initial radii $R_1$, $R_2$, $R_3$, $R_4$, $R_5$, $R_6$, $R_7$, $R_8$, $R_9$, $R_{10}$, $R_{11}$, $R_{12}$ (as shown in FIG. 1C), respectively. It should be noted that the second initial radii $R_1$, $R_2$, $R_3$, $R_4$, $R_5$, RE, $R_7$, $R_8$, $R_9$, $R_{10}$, $R_{11}$, $R_{12}$ of the second spiral arms 220 are different from each other, and different from the first initial radius $R_0$; in other words, a length of the first initial radius $R_0$ is different from a plurality of lengths of the second initial radii $R_1$, $R_2$, Ra, $R_4$, $R_5$, $R_6$, $R_7$, $R_8$, $R_9$, $R_{10}$, $R_{11}$, $R_{12}$, and the lengths of the second initial radii $R_1$, $R_2$, $R_3$, $R_4$, $R_5$, $R_6$, $R_7$, Ra, $R_9$. $R_{10}$. $R_{11}$. $R_{12}$ are different from each other too. The dielectric layer 300 has a top surface 301 and a bottom surface 302, and the top surface 301 is connected to the first conductive layer 200. The second conductive layer 400 is connected to the bottom surface 302 of the dielectric layer 300.

The conventional logarithmic spiral antennas usually employ multi-layered structure in a single unit cell to absorb electromagnetic (EM) waves in the wide frequency range. However, the conventional logarithmic spiral antennas are complex in nature, which makes difficulty in fabrication process. In addition, the conventional logarithmic spiral antennas are only used for broadband absorption below infrared (IR) band. The difference between the conventional logarithmic spiral antennas and the augmented logarithmic spiral antenna structure 100 of the present disclosure is that, the augmented logarithmic spiral antenna structure 100 can operate in the IR band of frequency ranges from 4.5 THz to 100 THz, and achieve the THz absorption over 88.5% within the operating frequency band due to a hybrid logarithmic spiral structure formed by the first spiral arm 210 and the second spiral arms 220. This hybrid logarithmic spiral structure can minimize the reflection of EM waves from a surface of the first conductive layer 200 and improve the absorption bandwidth significantly. Therefore, the augmented logarithmic spiral antenna structure 100 not only maintains the absorption bandwidth within the working frequency regime, but also reduces the size of the antenna.

In detail, the first spiral arm 210 shown in FIG. 1C can further include a first inner curve radius $R_{10}$, a first outer curve radius $R_{o0}$, a flare rate, an angular position and a phase shift between two consecutive curves of the first spiral arm 210, and the following equations (1), (2) and (3) are satisfied.

$$r_1 = r_o e^{\alpha \phi}; \quad (1)$$

$$r_2 = r_o e^{\alpha(\phi+\delta)}; \quad (2)$$

$$\varepsilon = e^{2\pi a}. \quad (3)$$

In the equations (1), (2) and (3), $r_0$ is the first initial radius $R_0$. $r_1$ is the first inner curve radius $R_{10}$. $r_2$ is the first outer curve radius $R_{o0}$. $\alpha$ is the flare rate, which controls a growth rate of the first spiral arm 210 and is related to the number of turns of the first spiral arm 210. $\phi$ Is the angular position that varies from 0 to $3\pi$. $\delta$ is the phase shift. The flare rate can be represented by an expansion ratio in the equation (3), and $\varepsilon$ is the expansion ratio.

In particular, the first conductive layer 200 consists of multi-arm spirals (i.e., the first spiral arm 210 and the second spiral arms 220) with different radii (i.e., the first initial radius $R_0$ and the second initial radii $R_1$, $R_2$, $R_3$, $R_4$, $R_5$, $R_6$, $R_7$, $R_8$, $R_9$, $R_{10}$, $R_{11}$, $R_{12}$) and growth rates. The second spiral arms 220 are mounted at the outer circumference of the first spiral arm 210 to make the hybrid logarithmic spiral structure.

For the first spiral arm 210, $r_0$=0.4 μm, $\alpha$=0.2, and $\phi$=0 to $3\pi$, are taken for the best performance of the augmented logarithmic spiral antenna structure 100. In FIG. 1C, a number of the second spiral arms 220 can be twelve, a flare rate and an angular position of each of the second spiral arms 220 can be the same as the flare rate and the angular position of the first spiral arm 210, but each of the second initial radii $R_1$, $R_2$, $R_3$, $R_4$, $R_5$, $R_6$, $R_7$, $R_8$, $R_9$, $R_{10}$, $R_{11}$, $R_{12}$ is different from the first initial radius $R_0$. The optimized structure dimensions (μm) of the first spiral arm 210 are listed in Table 1A, the optimized structure dimensions (μm) of the second spiral arms 220 are listed in Table 1B, and the present disclosure is not limited thereto.

TABLE 1A

First spiral arm

| First initial radius | First inner curve radius | First outer curve radius |
|---|---|---|
| 0.4 | 1.05 | 1.2 |

TABLE 1B

Second spiral arms

| Second initial radii | | Second inner curve radii | | Second outer curve radii | |
|---|---|---|---|---|---|
| $R_1$ | 0.15 | $R_{i1}$ | 0.15 | $R_{o1}$ | 0.225 |
| $R_2$ | 0.175 | $R_{i2}$ | 0.175 | $R_{o2}$ | 0.3 |
| $R_3$ | 0.2 | $R_{i3}$ | 0.2 | $R_{o3}$ | 0.375 |
| $R_4$ | 0.225 | $R_{i4}$ | 0.225 | $R_{o4}$ | 0.45 |
| $R_5$ | 0.25 | $R_{i5}$ | 0.25 | $R_{o5}$ | 0.525 |
| $R_6$ | 0.275 | $R_{i6}$ | 0.275 | $R_{o6}$ | 0.6 |
| $R_7$ | 0.3 | $R_{i7}$ | 0.3 | $R_{o7}$ | 0.675 |
| $R_8$ | 0.325 | $R_{i8}$ | 0.325 | $R_{o8}$ | 0.75 |
| $R_9$ | 0.35 | $R_{i9}$ | 0.35 | $R_{o9}$ | 0.825 |
| $R_{10}$ | 0.375 | $R_{i10}$ | 0.375 | $R_{o10}$ | 0.9 |
| $R_{11}$ | 0.425 | $R_{i11}$ | 0.425 | $R_{o11}$ | 0.975 |
| $R_{12}$ | 0.45 | $R_{i12}$ | 0.45 | $R_{o12}$ | 1.05 |

Moreover, the augmented logarithmic spiral antenna structure 100 of the present disclosure can be applied to an EM wave absorber for EM energy harvesting. Perfect EM wave absorber is a device in which all incident radiation is absorbed efficiently at the operating wavelengths. Once the radiation is absorbed by the device, it transformed into ohmic heat or other form of energies. Thus, reflection, transmission, scattering and all other waves propagation are not observed as they pass through the perfect EM wave absorber. When the first conductive layer 200 absorbs EM energy, electric and magnetic resonances result in high-energy absorption by the hybrid logarithmic spiral structure. As the incoming wave interacts with the first conductive layer 200, electron resonance occurs at the first conductive layer 200 and creates an oscillating current that induces the EM energy dissipation over the hybrid logarithmic spiral structure. In general, the conventional absorbers are made of materials with high intrinsic losses, but the augmented logarithmic spiral antenna structure 100 of the present disclosure can be mainly made of noble metals.

For example, the first conductive layer 200 consists of a lossy metal. The dielectric layer 300 consists of a highly insulated material. The second conductive layer 400 consists of another lossy metal. In particular, the lossy metal is nickel (Ni), the highly insulated material is SU-8 and has a relative permittivity of 2.8, and the another lossy metal is gold (Au). The first conductive layer 200 is patterned whereas both of the dielectric layer 300 and the second conductive layer 400 are a continuous layer, which can avoid transmission of EM waves. The dielectric layer 300 is sandwiched between the first conductive layer 200 and the second conductive layer 400, or in other words, the first conductive layer 200 is laminated on the top surface 301 of the dielectric layer 300, and the bottom surface 302 of the dielectric layer 300 is laminated on the second conductive layer 400.

In FIG. 1B, a thickness of the first conductive layer 200 is $Z_1$, a thickness of the dielectric layer 300 is $Z_2$, a thickness of the second conductive layer 400 is $Z_3$, and the following condition is satisfied: $Z_1=Z_3<Z_2$. The thickness $Z_1$ of the first conductive layer 200 is greater than a skin depth of the first conductive layer 200, the thickness $Z_2$ of the dielectric layer 300 is greater than a penetration depth of the dielectric layer 300, and the thickness $Z_3$ of the second conductive layer 400 is greater than a skin depth of the second conductive layer 400. In FIG. 1C, a length L of the augmented logarithmic spiral antenna structure 100 is 17 μm, and a width W of the augmented logarithmic spiral antenna structure 100 is 13 μm.

In detail, the thickness $Z_1$ of the first conductive layer 200 and the thickness $Z_3$ of the second conductive layer 400 are 0.2 μm. The thickness $Z_2$ of the dielectric layer 300 is 5.54 μm with a relative permittivity ($\varepsilon_r$) of 2.8. The overall thickness of the augmented logarithmic spiral antenna structure 100 is 5.94 μm. Properties of gold (Au), nickel (Ni) and SU-8 are listed in Table 2, and the present disclosure is not limited thereto.

TABLE 2

| Properties | Materials | | |
|---|---|---|---|
| | Gold (Au) | Nickel (Ni) | SU-8 |
| Relative permittivity ($\varepsilon_r$) | | | 2.8 |
| Relative permeability ($\mu_r$) | 1 | 600 | 1 |
| Electrical conductivity ($\sigma$) | 4.10e+07 | 1.64e+07 | |
| Thermal conductivity (k) | 314 | 91 | 0.2 |
| Density ($\rho$) | 19320 | 8900 | 1200 |
| Heat capacity ($C_p$) | 0.13 | 0.45 | 1.6 |
| Young modulus (Y) | 78 | 207 | 4.02 |
| Poisson's ratio (P) | 0.42 | 0.31 | 0.22 |
| Thermal expansion coefficient ($\alpha$) | 14.1 | 13.3 | 87.1 |

Figure 2A:
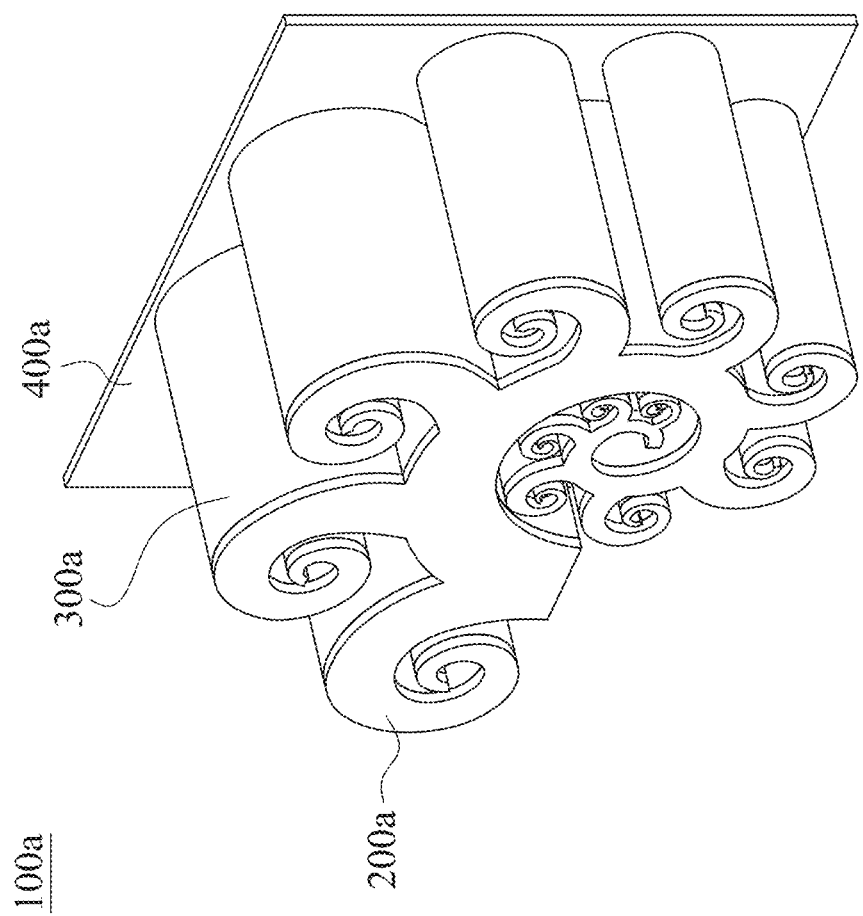
FIG. 2A shows a three-dimensional schematic view of an augmented logarithmic spiral antenna structure according to the second embodiment of the present disclosure.
Figure 2B:
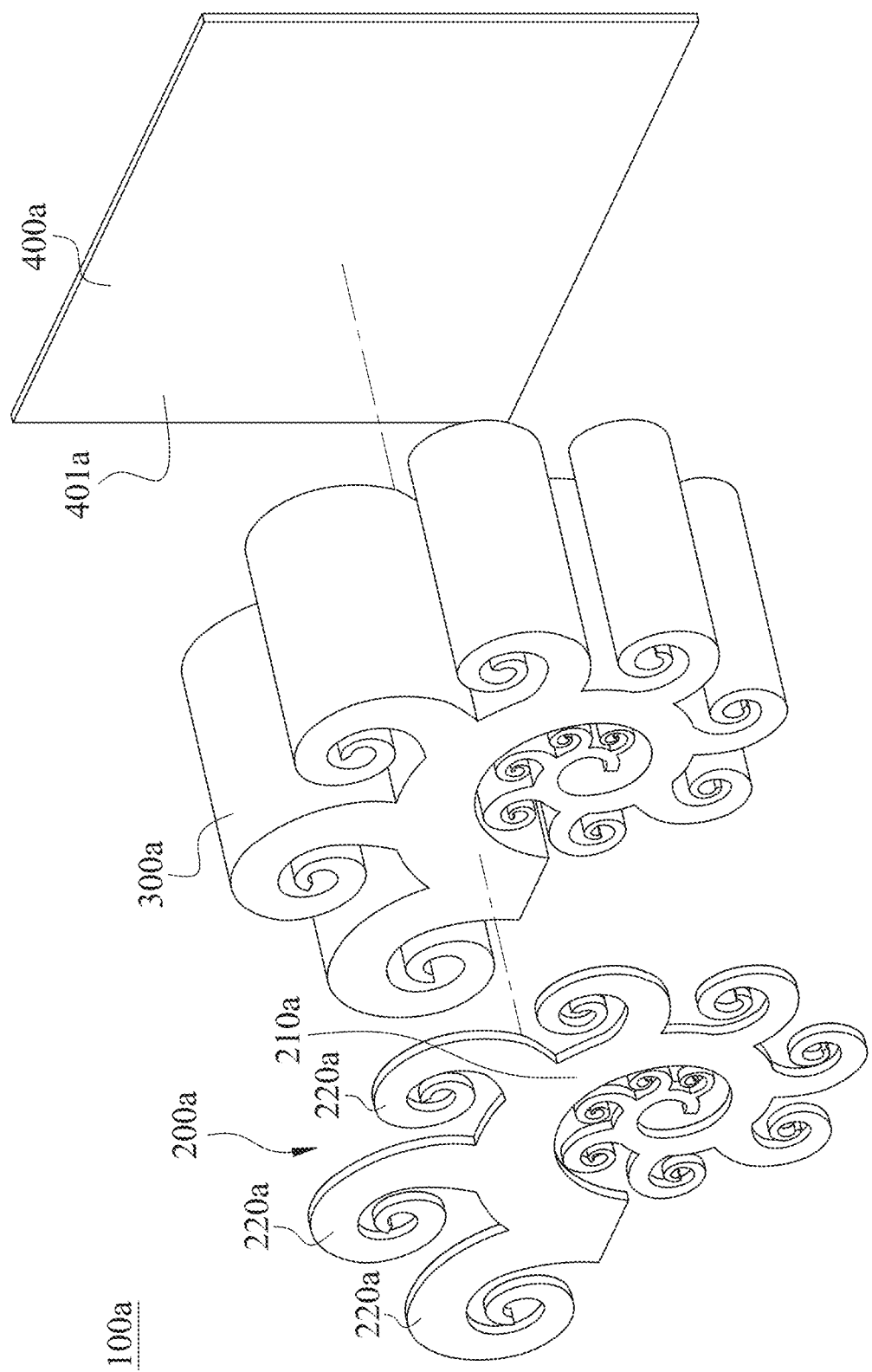
FIG. 2B shows an exploded view of the augmented logarithmic spiral antenna structure of FIG. 2A.

Please refer to FIG. 2A and FIG. 2B. FIG. 2A shows a three-dimensional schematic view of an augmented logarithmic spiral antenna structure 100a according to the second embodiment of the present disclosure. FIG. 2B shows an exploded view of the augmented logarithmic spiral antenna structure 100a of FIG. 2A. As shown in FIGS. 2A and 2B, the augmented logarithmic spiral antenna structure 100a includes a first conductive layer 200a, a dielectric layer 300a and a second conductive layer 400a. The first conductive layer 200a has a first pattern and includes a first spiral arm 210a and a plurality of second spiral arms 220a. The second spiral arms 220a are disposed around and connected to the first spiral arm 210a. The first pattern of the first conductive layer 200a formed by the first spiral arm 210a and the second spiral arms 220a is the same as the aforementioned hybrid logarithmic spiral structure of the first conductive layer 200 in FIG. 1C. The dielectric layer 300a is connected to the first conductive layer 200a. The second conductive layer 400a is connected to the dielectric layer 300a, and the dielectric layer 300a is located between the first conductive layer 200a and the second conductive layer 400a. In particular, the first conductive layer 200a and the second conductive layer 400a are the same as the elements corresponding to the augmented logarithmic spiral antenna structure 100 of the first embodiment, and are not be described again herein.

The difference between the augmented logarithmic spiral antenna structure 100a and the augmented logarithmic spiral antenna structure 100 is that, the dielectric layer 300a has a second pattern, and the second pattern is the same as the first pattern; in short, the structure of the dielectric layer 300a is the same as the structure of the first conductive layer 200a, but the first conductive layer 200a consists of nickel (Ni), and the dielectric layer 300a consists of SU-8. In addition, the second conductive layer 400a have a surface 401a, the first conductive layer 200a is laminated on the dielectric layer 300a, the first pattern is aligned with the second pattern, and the dielectric layer is laminated on the surface 401a of the second conductive layer 400a. An impedance matching network is necessary to achieve better performance for the augmented logarithmic spiral antenna structure 100a. Thus, proper impedance matching and superimposing multiple resonances are two key factors of the augmented logarithmic spiral antenna structure 100a to realize perfect broadband characteristics. In this way, the reflectivity from the surface of the first conductive layer 200a can be reduced, resulting in enhancement of absorption of the augmented logarithmic spiral antenna structure 100a in a wide range of frequencies. Thus, both of the first conductive layer 200a and the dielectric layer 300a are configured in the hybrid logarithmic spiral structure to realize broadband absorption in the operating frequency ranges. Therefore, the augmented logarithmic spiral antenna structure 100a of the present disclosure is not only able to achieve high and broadband absorption of EM waves, but also easy to fabricate, having smaller thickness and reducing low cost.

Figure 3:
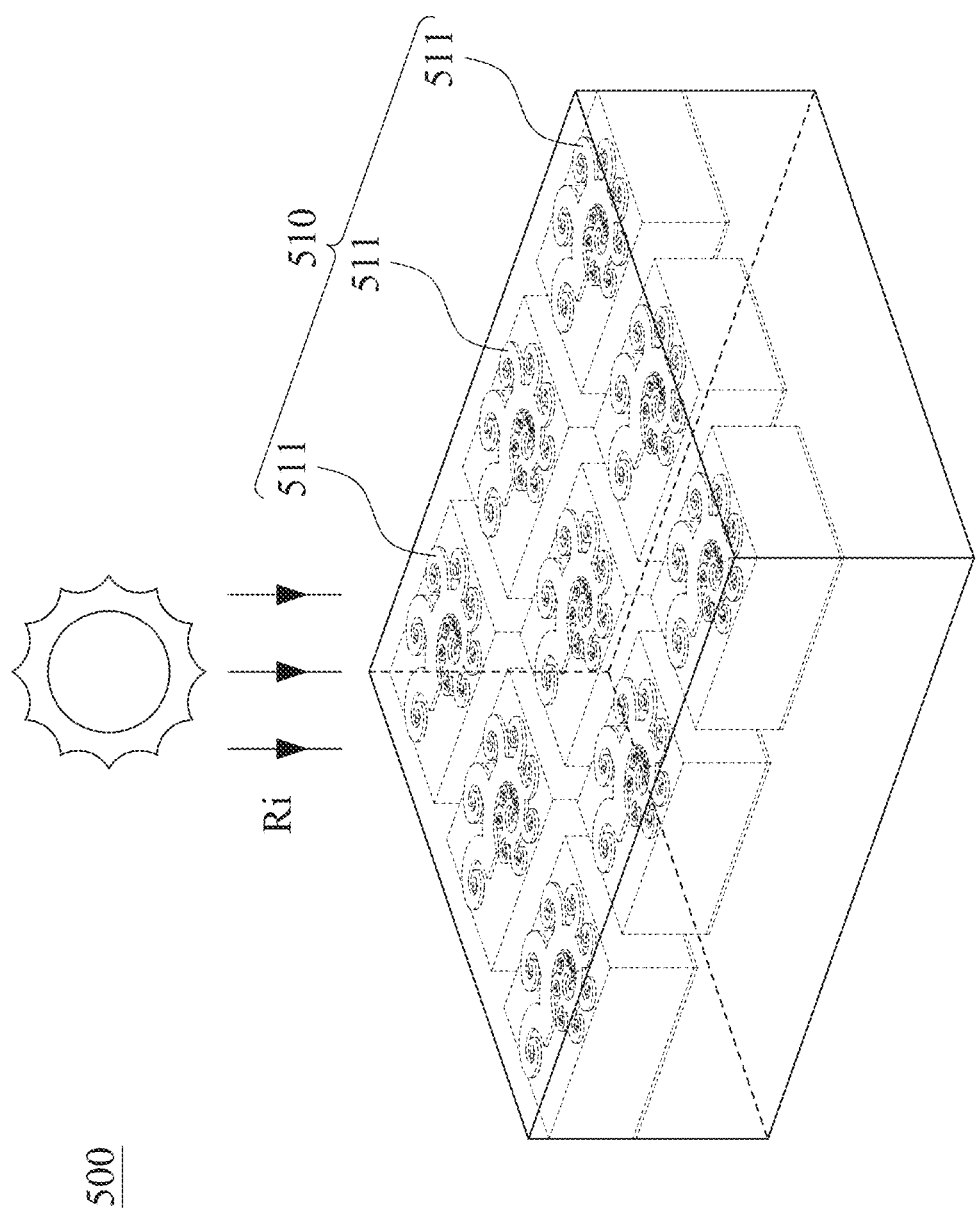
FIG. 3 shows a schematic view of an electromagnetic wave energy absorber according to the third embodiment of the present disclosure.
Figure 9B:
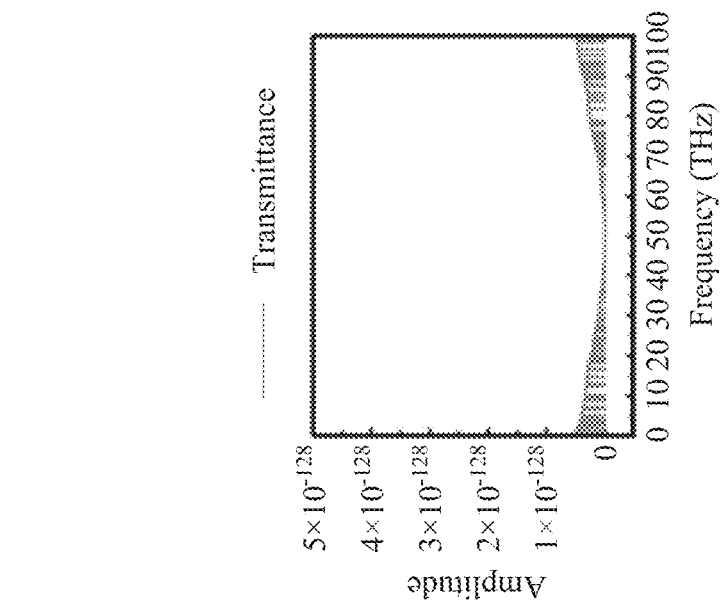
FIG. 9B shows a curve diagram of transmittance of the augmented logarithmic spiral antenna structure of FIG. 1A under normal incidence of the plane wave.
Figure 9A:
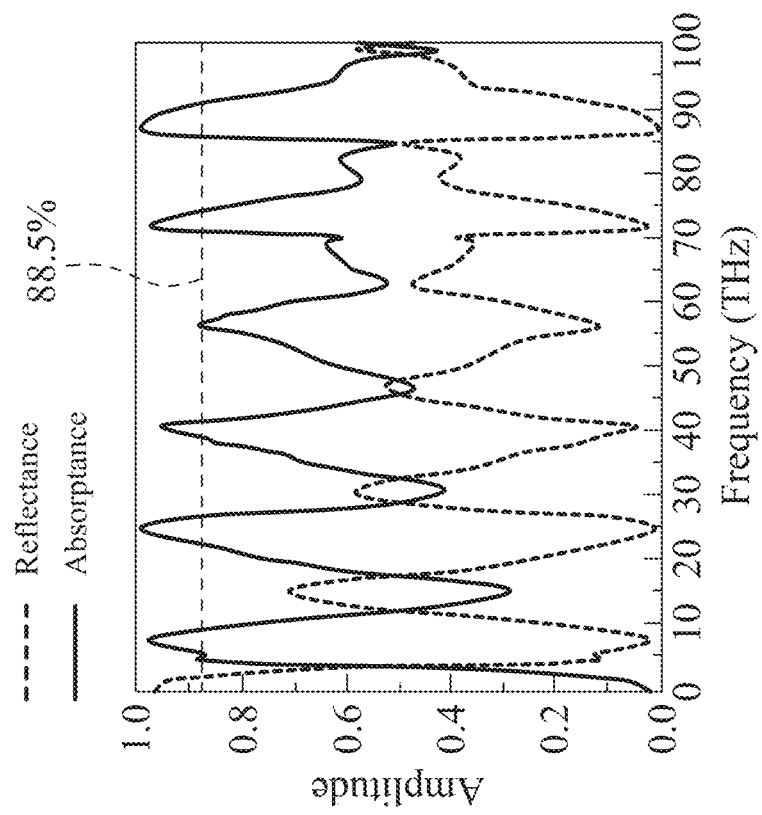
FIG. 9A shows a curve diagram of reflectance and absorptance of the augmented logarithmic spiral antenna structure of FIG. 1A under normal incidence of a plane wave.

Please refer to FIG. 1A and FIG. 3. FIG. 3 shows a schematic view of an electromagnetic wave energy absorber 500 according to the third embodiment of the present disclosure. As shown in FIG. 3, the electromagnetic wave energy absorber 500 includes a nanoantenna 510. The nanoantenna 510 includes at least one augmented logarithmic spiral antenna structure 511. In the third embodiment, a number of the at least one augmented logarithmic spiral antenna structure 511 can be plural (e.g., nine), and each of the augmented logarithmic spiral antenna structures 511 is the same as the augmented logarithmic spiral antenna structure 100 of FIG. 1A. The nanoantenna 510 is configured to absorb an incident radiation Ri, and a frequency of the incident radiation Ri is f, and the following condition is satisfied: 4.5 THz<f≤100 THz. The incident radiation Ri is incident on the nanoantenna 510 in a normal direction, and the nanoantenna 510 has an average absorption corresponding to the incident radiation Ri. The average absorption is AA, and the following condition is satisfied: 88.5%≤AA. In particular, the nanoantenna 510 is based on the augmented logarithmic spiral antenna structure 100, and numerically analyzed to show that it is a promising candidate for energy harvesting applications in Infrared (IR) to Ultraviolet (UV) regime. The effects of the electromagnetic wave energy absorber 500 on the absorption performance are tested and simulated to show a high performance in both bandwidth and absorptivity (average absorption of 88.5% spanning a broad range from IR to visible, i.e., from 4 THz to 100 THz, as shown in FIGS. 9A and 9B in the following paragraph). In other embodiments, the augmented logarithmic spiral antenna structure 511 can also be used in an energy harvesting device using in an antenna. For example, broadband energy harvesting combing with the antenna can be achieved by direct RF energy harvesting to DC using rectifier, Thermoelectric, Bolometer, Pyroelectric or Quantum type detector such as InGaAs and photoconductive materials.

Figure 4:
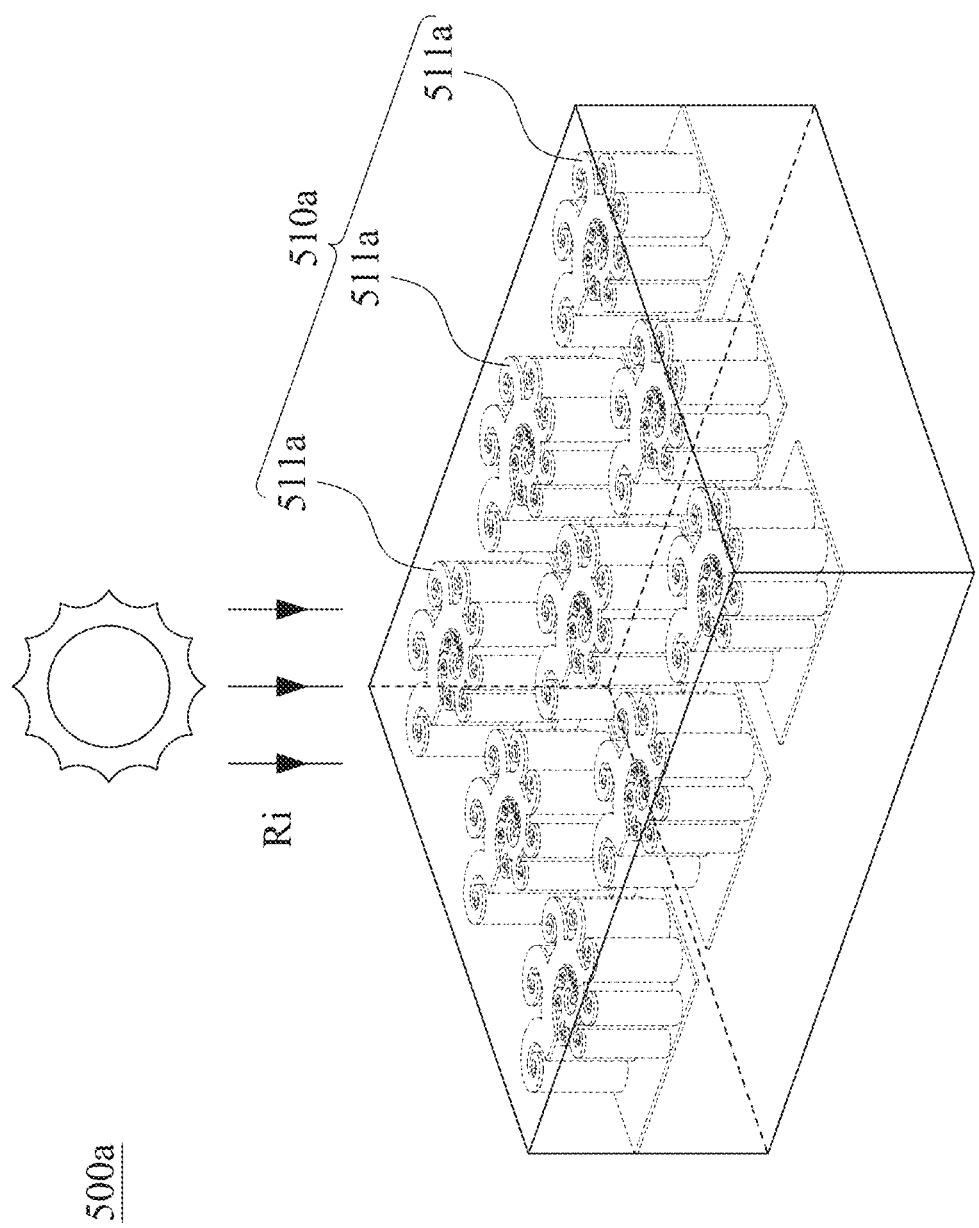
FIG. 4 shows a schematic view of an electromagnetic wave energy absorber according to the fourth embodiment of the present disclosure.
Figures 9C, 9D:
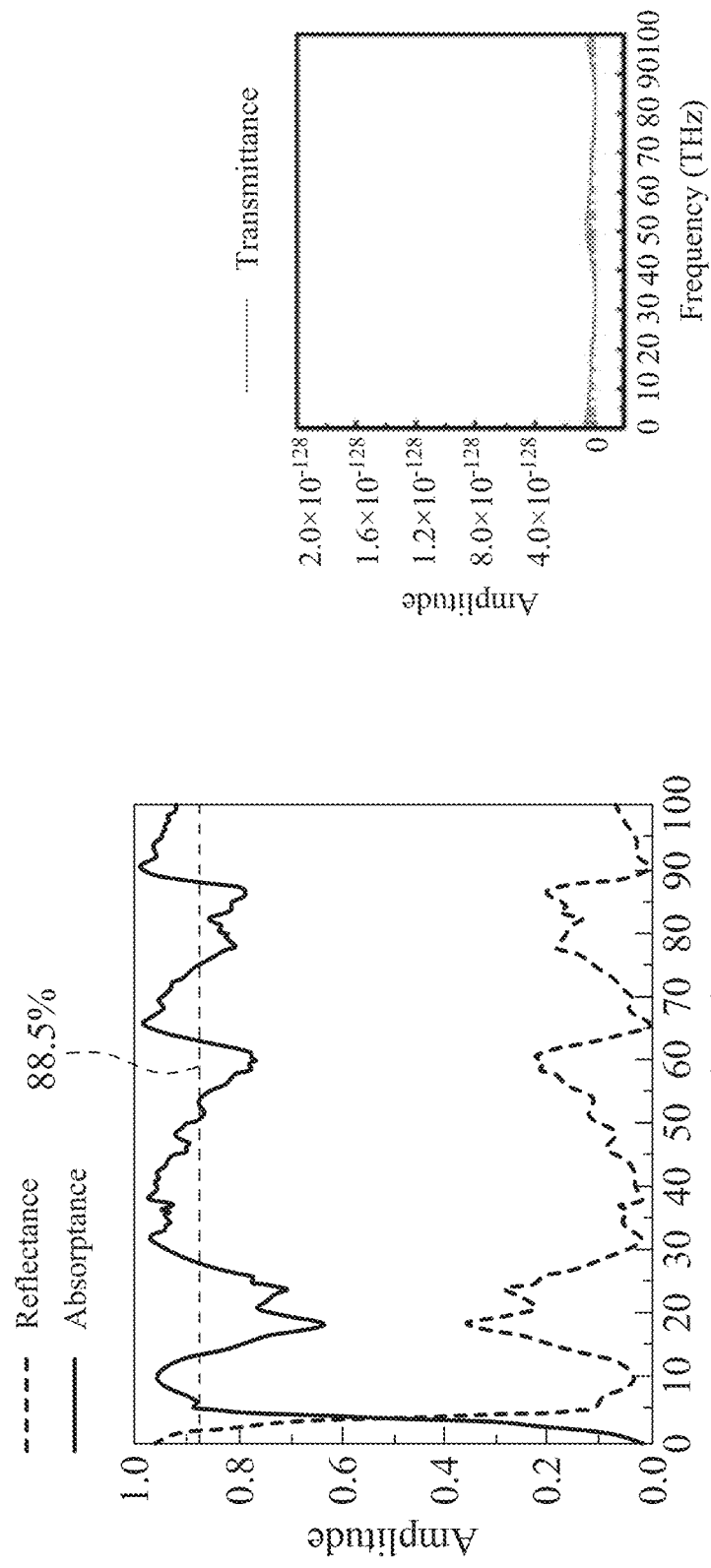
FIG. 9C shows a curve diagram of reflectance and absorptance of the augmented logarithmic spiral antenna structure of FIG. 2A under normal incidence of the plane wave.
FIG. 9D shows a curve diagram of transmittance of the augmented logarithmic spiral antenna structure of FIG. 2A under normal incidence of the plane wave.

Please refer to FIG. 2A and FIG. 4. FIG. 4 shows a schematic view of an electromagnetic wave energy absorber 500a according to the fourth embodiment of the present disclosure. As shown in FIG. 4, the electromagnetic wave energy absorber 500a includes a nanoantenna 510a. The nanoantenna 510a includes at least one augmented logarithmic spiral antenna structure 511a. In the fourth embodiment, a number of the at least one augmented logarithmic spiral antenna structure 511a can be plural (e.g., nine), and each of the augmented logarithmic spiral antenna structures 511a is the same as the augmented logarithmic spiral antenna structure 100a of FIG. 2A. The nanoantenna 510a is configured to absorb an incident radiation Ri, and a frequency of the incident radiation Ri is f, and the following condition is satisfied: 4.5 THz<f≤100 THz. The incident radiation Ri is incident on the nanoantenna 510a in a normal direction, and the nanoantenna 510a has an average absorption corresponding to the incident radiation Ri. The average absorption is AA, and the following condition is satisfied: 88.5%≤AA. In particular, the nanoantenna 510a is based on the augmented logarithmic spiral antenna structure 100a, and numerically analyzed to show that it is a promising candidate for energy harvesting applications in Infrared (IR) to Ultraviolet (UV) regime. The effects of the electromagnetic wave energy absorber 500a on the absorption performance are tested and simulated to show a high performance in both bandwidth and absorptivity (average absorption of 88.5% spanning a broad range from IR to visible, i.e., from 4 THz to 100 THz, as shown in FIGS. 9C and 9D in the following paragraph). In other embodiments, the augmented logarithmic spiral antenna structure 511a can also be used in an energy harvesting device using in an antenna. For example, broadband energy harvesting combing with the antenna can be achieved by direct RF energy harvesting to DC using rectifier, Thermoelectric, Bolometer, Pyroelectric or Quantum type detector such as InGaAs and photoconductive materials.

Figure 5:
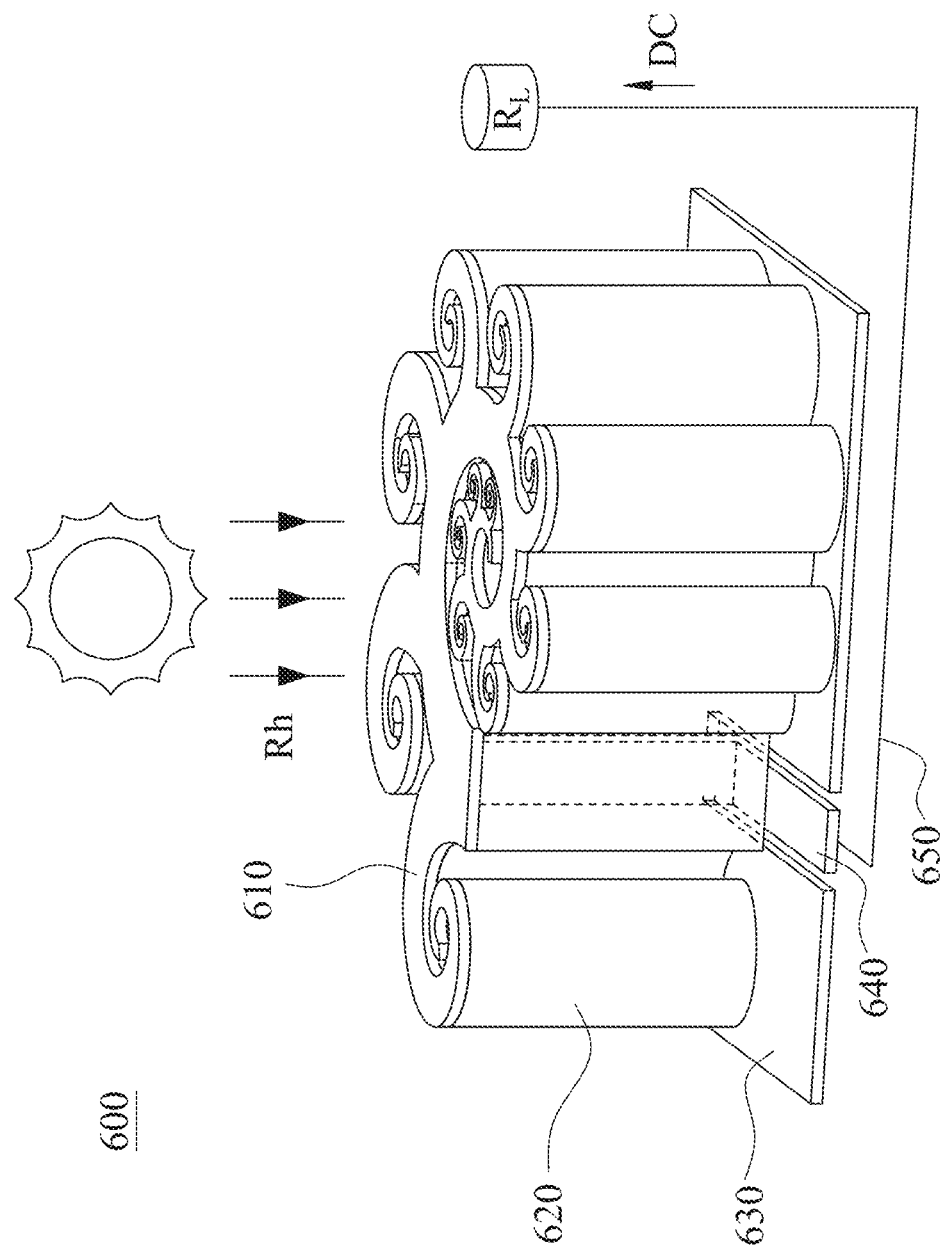
FIG. 5 shows a schematic view of a thermoelectric energy harvester according to the fifth embodiment of the present disclosure.

Please refer to FIG. 2A and FIG. 5. FIG. 5 shows a schematic view of a thermoelectric energy harvester 600 according to the fifth embodiment of the present disclosure. As shown in FIG. 5, the thermoelectric energy harvester 600 includes a first conductive layer 610, a dielectric layer 620, a second conductive layer 630, a contact electrode 640 and a coaxial cable 650. The structural configuration among the first conductive layer 610, the dielectric layer 620 and the second conductive layer 630 have the same structural configuration as the elements corresponding to the augmented logarithmic spiral antenna structure 100a of FIG. 2A, and are not be described again herein. However, the dimensions of the first conductive layer 610, the dielectric layer 620 and the second conductive layer 630 can be the same or different from the elements corresponding to the augmented logarithmic spiral antenna structure 100a of FIG. 2A.

The first conductive layer 610 receives a heat radiation Rh. The contact electrode 640 is disposed through the dielectric layer 620 and electrically connected between the first conductive layer 610 and the second conductive layer 630. The coaxial cable 650 is electrically connected to the contact electrode 640 and converts the heat radiation Rh into a direct current DC according to a Seebeck effect (Diffusion of electrons due to the heat radiation Rh). The direct current DC is delivered to a load $R_L$ and provides a power source for the load $R_L$.

The thermoelectric energy harvester 600 can be a portable or wearable thermoelectric generator, which uses the flexible conductive thermoelectric materials and the ultra-wideband antenna as one of the heat receiving end of thermoelectric (TE) module so that ambient energy from the surrounding can be captured. The TE module is basically a circuit consists of two distinct thermoelectric materials that when combine can generate electricity from heat directly. The TE module consists of two dissimilar thermoelectric materials joining in their ends. One end makes of an N-type (electron rich) semiconductor, the other one makes of a P-type (electron lacking) semiconductor. In detail, the first conductive layer 610 consists of a P-type semiconductor, and the second conductive layer 630 consists of an N-type semiconductor. In particular, the P-type semiconductor of the first conductive layer 610 consists of nickel or one of a plurality of P-type conductive materials, and the N-type semiconductor of the second conductive layer consists of gold or one of a plurality of N-type conductive materials. The first conductive layer 610 utilizes the hybrid logarithmic spiral structure as a heat receiving end of the thermoelectric energy harvester 600 to improve energy absorption and frequency range. Table 3 lists the possible P-type and N-type semiconductor candidates for the first conductive layer 610 and the second conductive layer 630 and thermoelectric performance thereof.

TABLE 3

| Materials | Seebeck coefficient (S) | Electrical conductivity ($\sigma$) | Thermal conductivity (k) | Power factor (PF) | Thermoelectric figure of merit (ZT) |
|---|---|---|---|---|---|
| Ag2Se/Nylon membrane | −140 (N-type) | 497 | | 987 | |
| Hg$_2$Se | −518 | 20 | 0.24 | 550 | 0.68 |
| SrTi$_{0.8}$Nb$_{0.2}$O$_3$ | −1000 | | | | 2.4 |
| PbTe/PEDOT | 2500 | 0.2 | | 1.4 | |
| Ag$_2$Se/PVP | 143 | 929 | 0.5 | 1910 | 1.1 |
| PEDOT NW/PEDOT:PSS | 38.9 | 700 | | 446.6 | 0.44 |
| sRBA-PEDOT:PSS | 47.2 | 1801 | | 401.2 | |
| Yb$_{2−x}$Eu$_x$CdSb$_2$ | 269 | | 0.26 | | 0.67 |
| PEDOT:OTf | 49.2 | 2342 | | 568 | |
| PEDOT:Tos | 40 | ~1000 | 0.37 | 38 | 0.25 |

Figure 6:
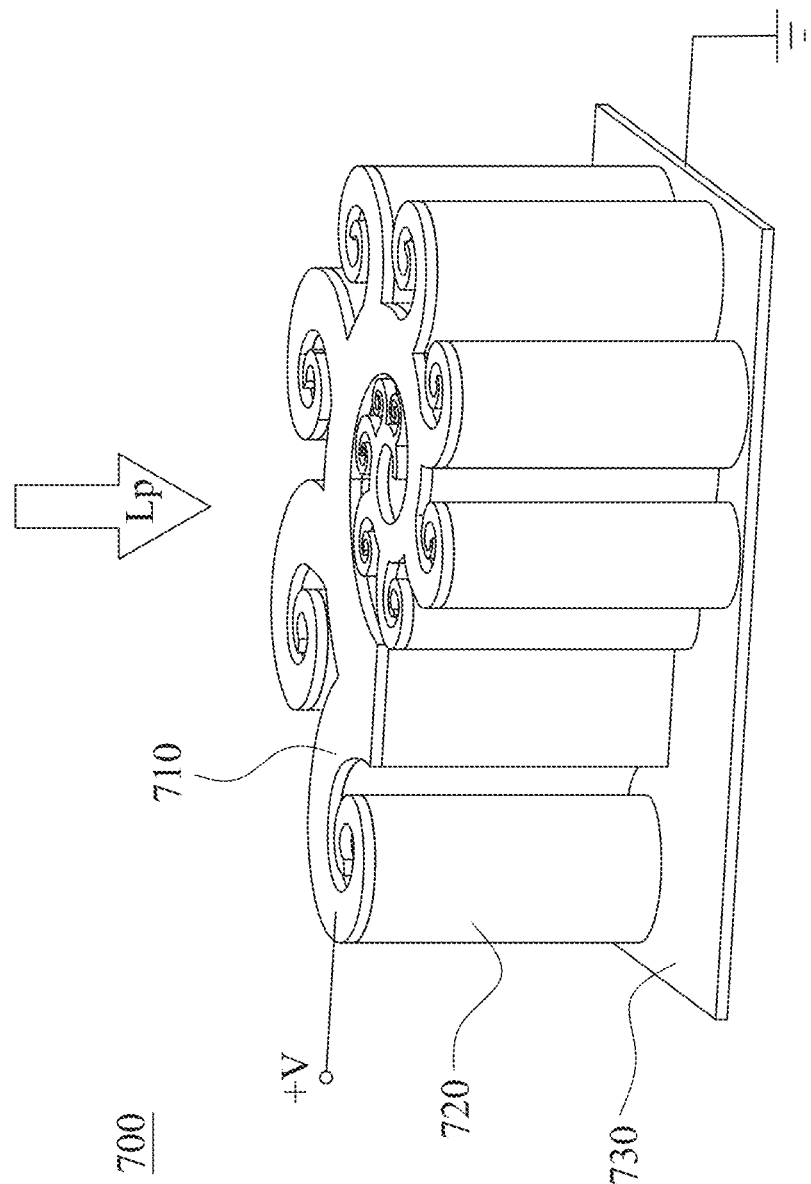
FIG. 6 shows a schematic view of a photoconductive antenna according to the sixth embodiment of the present disclosure.

Please refer to FIG. 2A and FIG. 6. FIG. 6 shows a schematic view of a photoconductive antenna 700 according to the sixth embodiment of the present disclosure. As shown in FIG. 6, the photoconductive antenna 700 includes a first conductive layer 710, a photo-absorbing semiconductor layer 720 and a second conductive layer 730, and is configured to replace one of a spiral antenna (not shown) and a bow tie antenna (not shown). The first conductive layer 710 is the same as the first conductive layer 200a of the augmented logarithmic spiral antenna structure 100a of FIG. 2A. The photo-absorbing semiconductor layer 720 is connected to the first conductive layer 710, and a structure of the photo-absorbing semiconductor layer 720 is the same as a structure of the dielectric layer 300a of the augmented logarithmic spiral antenna structure 100a of FIG. 2A. The second conductive layer 730 is connected to the photo-absorbing semiconductor layer 720, and a structure of the second conductive layer 730 is the same as a structure of the second conductive layer 400a of the augmented logarithmic spiral antenna structure 100a of FIG. 2A.

The photo-absorbing semiconductor layer 720 is located between the first conductive layer 710 and the second conductive layer 730. In short, the structural configuration among the first conductive layer 710, the photo-absorbing semiconductor layer 720, the second conductive layer 730 have the same structural configuration as the first conductive layer 200a, the dielectric layer 300a and the second conductive layer 400a of the augmented logarithmic spiral antenna structure 100a of the second embodiment, and are not be described again herein. In FIG. 6, the photoconductive antenna 700 receives a laser pulse Lp, and the laser pulse Lp excites carriers which are accelerated by a potential+V. The resulting charge separation causes dipole emission of terahertz frequencies. In detail, the photoconductive antenna 700 basically uses the photoductive effects to generate the electrical energy, and transmits and receives the radiation (normally in THz region). The photoconductive antenna 700 consists of a metal antenna (i.e., the first conductive layer 710 and the photo-absorbing semiconductor layer 720) patterned on a photoconductive substrate (i.e., the second conductive layer 730). In the sixth embodiment, the photoconductive antenna 700 is not used as an energy harvesting device, but used as a transceiver system.

Figure 7:
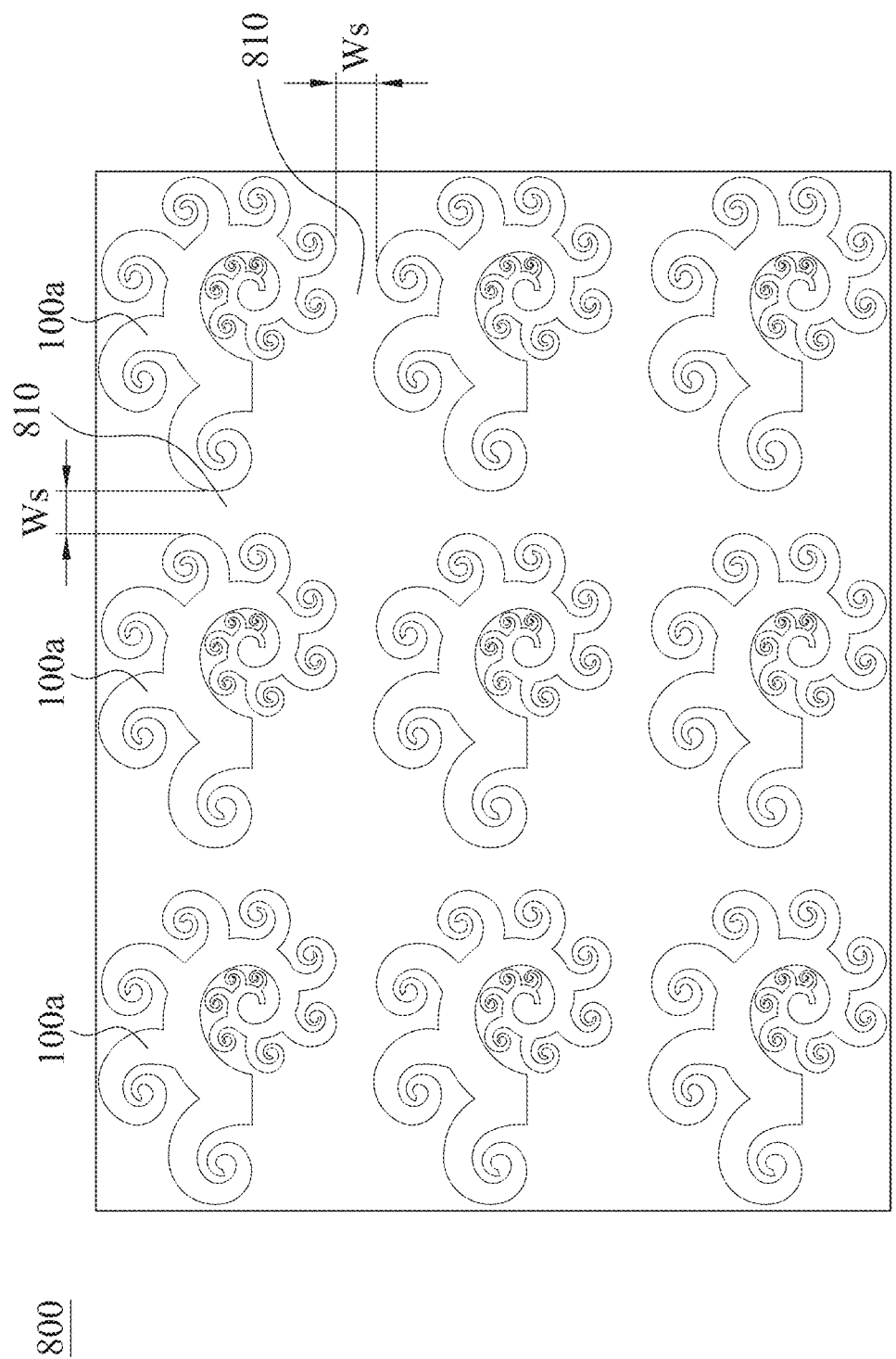
FIG. 7 shows a two-dimensional schematic view of an array antenna according to the seventh embodiment of the present disclosure.

Please refer to FIG. 2A and FIG. 7. FIG. 7 shows a two-dimensional schematic view of an array antenna 800 according to the seventh embodiment of the present disclosure. As shown in FIG. 7, the array antenna 800 includes a plurality of the augmented logarithmic spiral antenna structures 100a of FIG. 2A. Specifically, the array antenna 800 is composed of 3*3 array of the augmented logarithmic spiral antenna structure 100a; in other words, the augmented logarithmic spiral antenna structure 100a is a unit cell antenna structure of the array antenna 800. For the structure of the array antenna 800, the first conductive layers 200a of the augmented logarithmic spiral antenna structures 100a are arranged at intervals, and the dielectric layers 300a of the augmented logarithmic spiral antenna structures 100a are arranged at intervals. The second conductive layers 400a of the augmented logarithmic spiral antenna structures 100a are connected to each other or formed integrally. A slot 810 is located between each two of the augmented logarithmic spiral antenna structures 100a and has a width Ws. A plurality of the slots 810 are connected to each other in a grillage type. The widths Ws of the slots 810 are the same, and the width Ws of each of the slots 810 is 0.1 µm. In other embodiments, the first conductive layers of the augmented logarithmic spiral antenna structures can be electrically connected in series, and the dielectric layers of the augmented logarithmic spiral antenna structures can be electrically connected in series, so that it can increase the voltage output; or the first conductive layers of the augmented logarithmic spiral antenna structures can be connected in parallel, and the dielectric layers of the augmented logarithmic spiral antenna structures can be connected in parallel to increase the output current.

Figure 8:
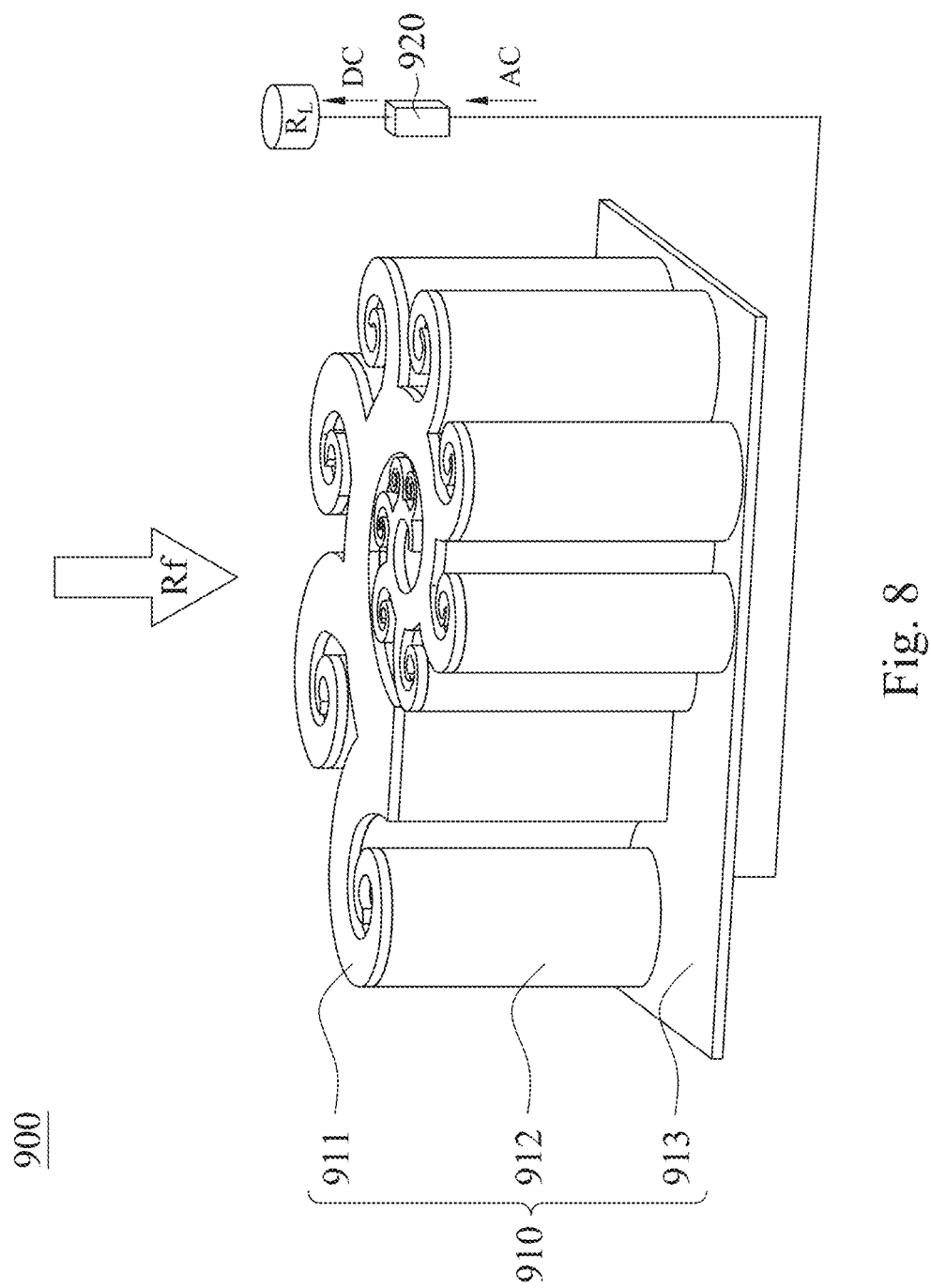
FIG. 8 shows a schematic view of a rectenna according to the eighth embodiment of the present disclosure.

Please refer to FIG. 2A and FIG. 8. FIG. 8 shows a schematic view of a rectenna 900 according to the eighth embodiment of the present disclosure. As shown in FIG. 8, the rectenna 900 can be used for a communication or an energy harvesting device, and includes an augmented logarithmic spiral antenna structure 910 and a rectifier module 920. The augmented logarithmic spiral antenna structure 910 can include a first conductive layer 911, a dielectric layer 912 and a second conductive layer 913. The structural configuration among the first conductive layer 911, the dielectric layer 912 and the second conductive layer 913 have the same structural configuration as the elements corresponding to the augmented logarithmic spiral antenna structure 100a of FIG. 2A, and are not be described again herein.

The first conductive layer 911 of the augmented logarithmic spiral antenna structure 910 receives a radio frequency signal Rf or a radiation (not shown). The rectifier module 920 is electrically connected to the second conductive layer 913 of the augmented logarithmic spiral antenna structure 910 and converts the radio frequency signal Rf or the radiation from an alternating current AC into a direct current DC. The direct current DC is delivered to a load $R_L$ and provides a power source for the load $R_L$. Specifically, in response to determining that the rectenna 900 receives the radio frequency signal Rf, the rectenna 900 can be used for the communication. In response to determining that the rectenna 900 receives the radiation, the rectenna 900 can be used for energy harvesting. The rectenna 900 of the eighth embodiment is a completely different energy harvesting device from the thermoelectric energy harvester 600 of FIG. 5. In FIG. 5, a radio frequency radiation (not shown) incident on the thermoelectric energy harvester 600 can be absorbed by the thermoelectric energy harvester 600, and converted into the direct current DC using rectification. In FIG. 8, the radio frequency signal Rf can be converted from the alternating current AC into the direct current DC by connecting the augmented logarithmic spiral antenna structure 910 to the rectifier module 920.

In the following part, the characteristics of the augmented logarithmic spiral antenna structure 100 of FIG. 1A and the augmented logarithmic spiral antenna structure 100a of FIG. 2A are tested, and the results thereof will be discussed.

<Test for Reflectance, Transmittance and Absorptance>

In order to shed light on the physical origin of ultra-wideband (UWB) absorption, the augmented logarithmic spiral antenna structure 100 and the augmented logarithmic spiral antenna structure 800a are tested under normal incidence to obtain reflectance, transmittance and absorptance. Please refer to FIGS. 9A, 9B, 9C and 9D. FIG. 9A shows a curve diagram of reflectance and absorptance of the augmented logarithmic spiral antenna structure 100 of FIG. 1A under normal incidence of a plane wave. FIG. 9B shows a curve diagram of transmittance of the augmented logarithmic spiral antenna structure 100 of FIG. 1A under normal incidence of the plane wave. FIG. 9C shows a curve diagram of reflectance and absorptance of the augmented logarithmic spiral antenna structure 100a of FIG. 2A under normal incidence of the plane wave. FIG. 9D shows a curve diagram of transmittance of the augmented logarithmic spiral antenna structure 100a of FIG. 2A under normal incidence of the plane wave. In FIGS. 9A and 9B, the augmented logarithmic spiral antenna structure 100 has observed an average absorption of more than 88.5% in the wide range of frequencies from 4.5 THz to 100 THz. In FIGS. 9C and 9D, the augmented logarithmic spiral antenna structure 100a has observed an average absorption of more than 88.5% in the wide range of frequencies from 4.5 THz to 100 THz.

In FIGS. 9A and 9B, it is clear that the augmented logarithmic spiral antenna structure 100 is showing multi and narrow band absorption characteristics, which represents that the augmented logarithmic spiral antenna structure 100 is of a resonator type. The narrow band absorption by the augmented logarithmic spiral antenna structure 100 can be due to the impedance mismatch between the material and the surrounding air. The absorption bandwidth is dramatically increased in the augmented logarithmic spiral antenna structure 100a, shown in FIGS. 9C and 9D. This improvement is due to geometric asymmetry of the hybrid logarithmic spiral structure and strong impedance matching between the first conductive layer 200a and the surrounding air. Another reason is that most of the reflected waves are destructively interfere with each other within the operating frequency range, and therefore less amount incident wave is reflected from the surface of the first conductive layer 200a, resulting in a wide band absorption.

<Tests for Transverse Electric (TE) mode and Transverse Magnetic (TM) Mode>

Figure 10A:
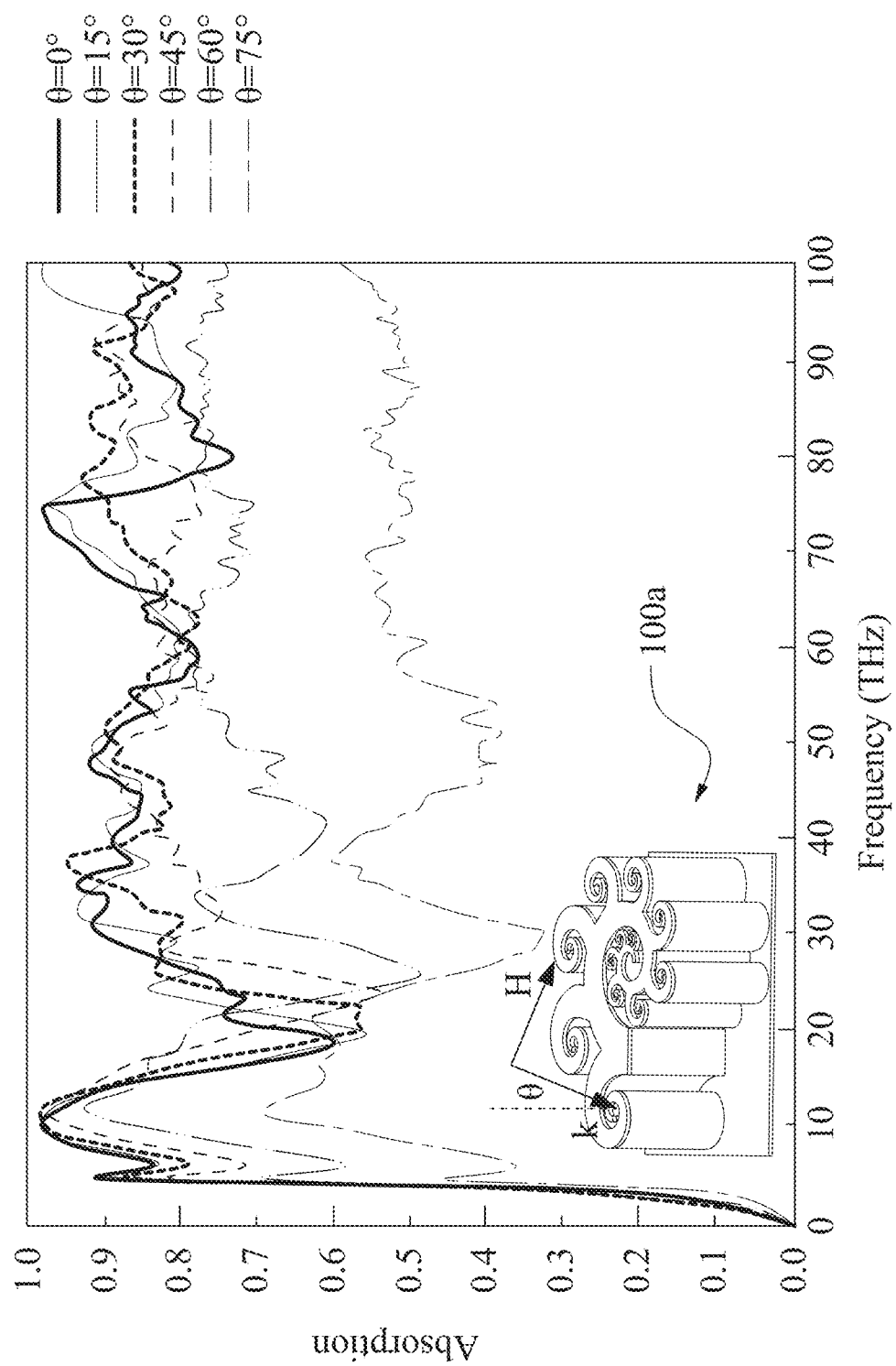
FIG. 10A shows a curve diagram of an absorption spectra of the augmented logarithmic spiral antenna structure of FIG. 2A with different incident angles ranging from 0° to 75° for Transverse Electric (TE) mode.
Figure 10B:
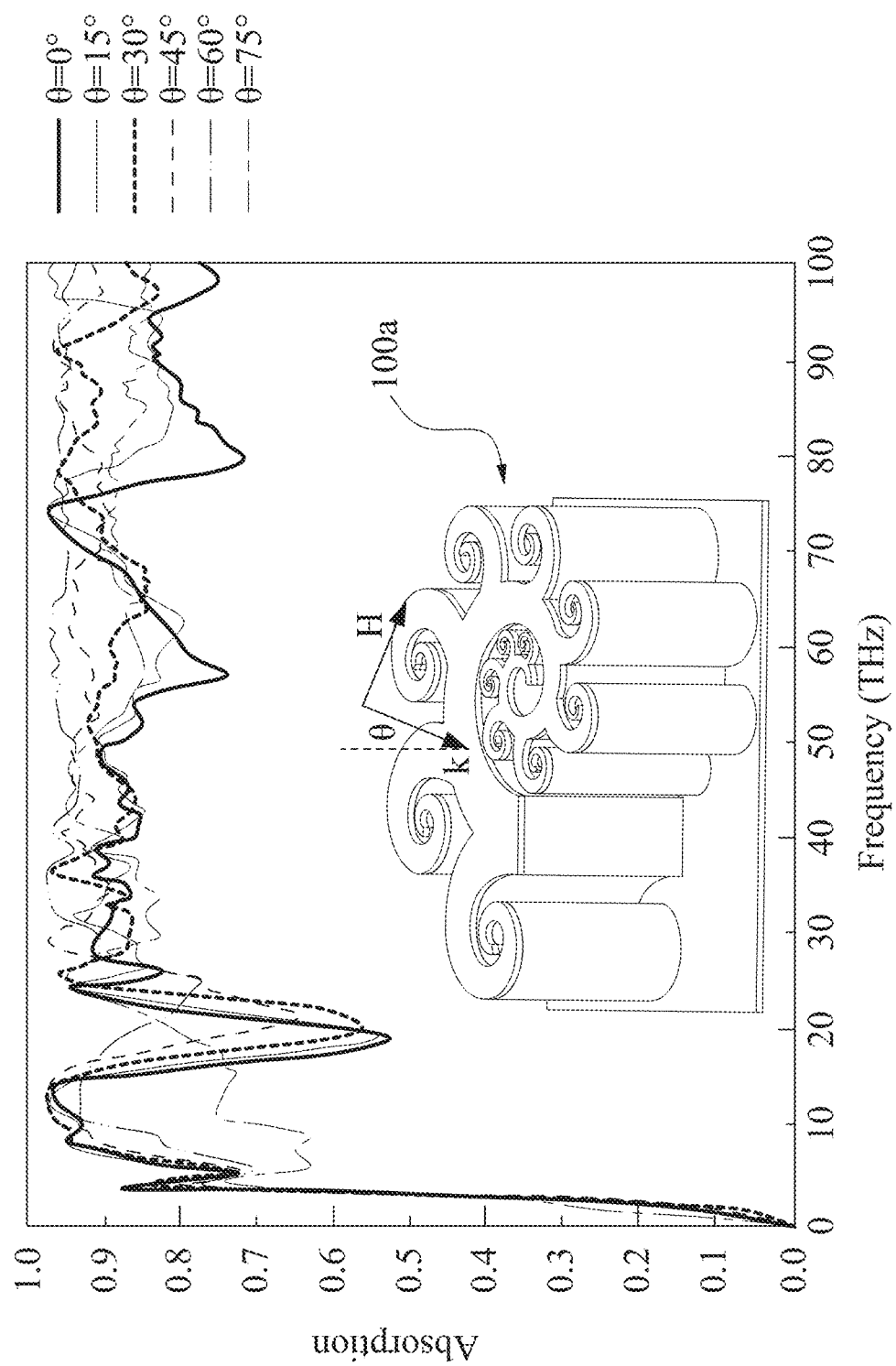
FIG. 10B shows a curve diagram of an absorption spectra of the augmented logarithmic spiral antenna structure of FIG. 2A with different incident angles ranging from 0° to 75° for Transverse Magnetic (TM) mode.
Figure 10C:
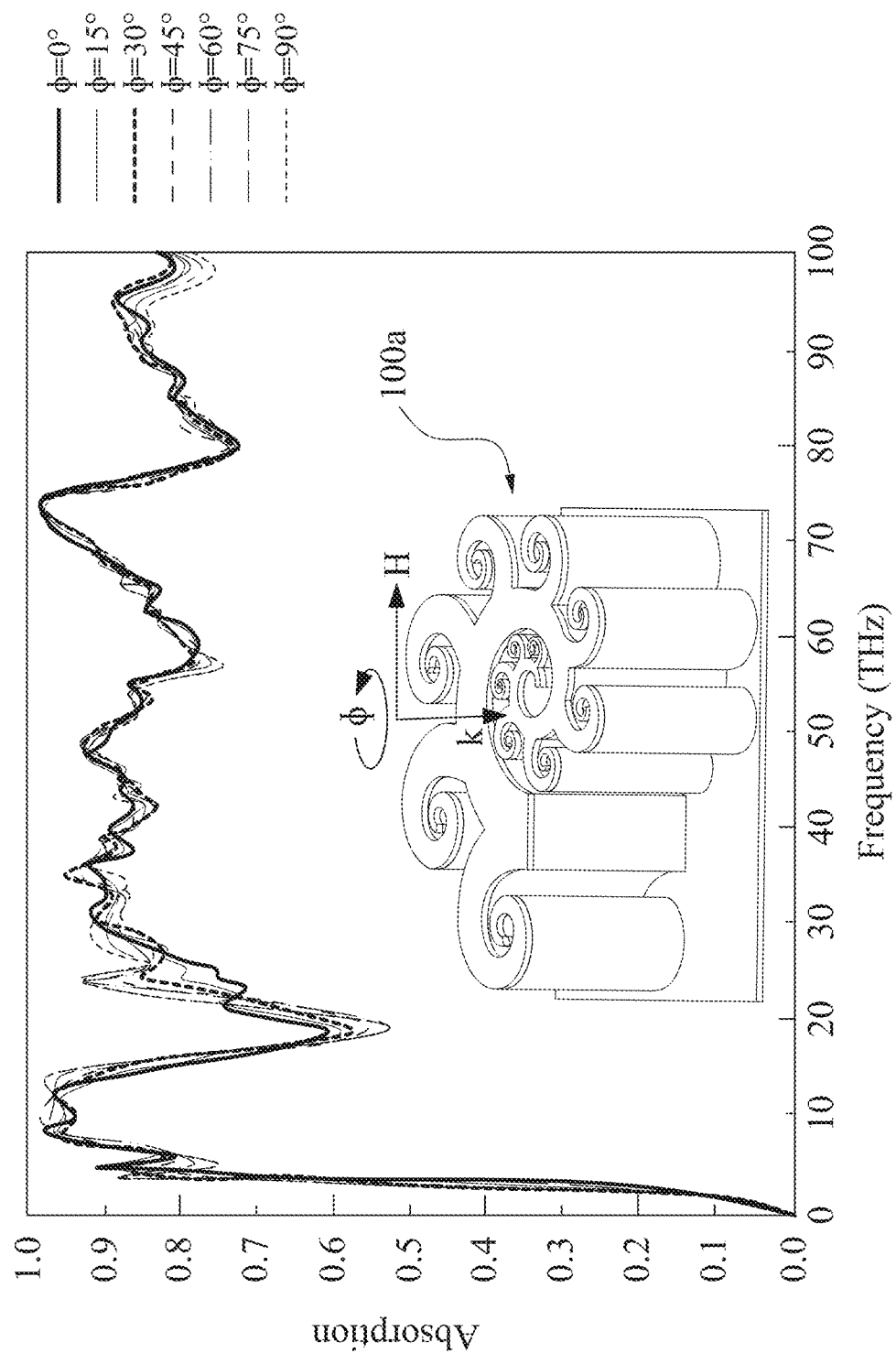
FIG. 10C shows a curve diagram of an absorption spectra of the augmented logarithmic spiral antenna structure of FIG. 2A with different polarization angles ranging from 0° to 90° for TE mode.
Figure 10D:
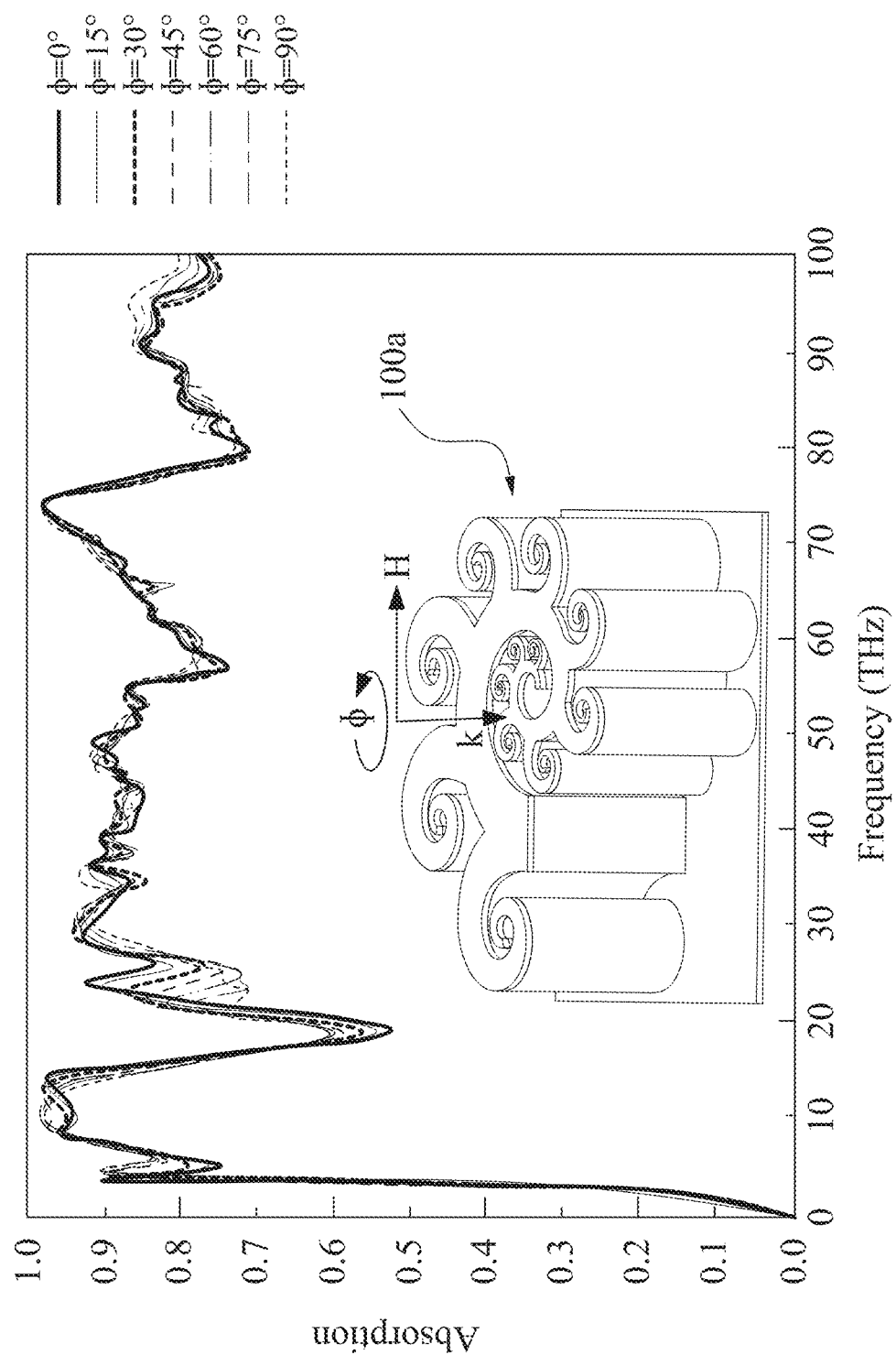
FIG. 10D shows a curve diagram of an absorption spectra of the augmented logarithmic spiral antenna structure of FIG. 2A with different polarization angles ranging from 0° to 90° for TM mode.

For the practical applications, the polarization-independent performance and a wide-angle incident wave are vitally important, since in some situations the incident wave is obliquely incident to the device. Therefore, the absorption performance under different EM environments (i.e., TE and TM modes) of the augmented logarithmic spiral antenna structure 100a is tested for normal as well as oblique incidences. Please refer to FIG. 10A, FIG. 10B, FIG. 10C and FIG. 10D. FIG. 10A shows a curve diagram of an absorption spectra of the augmented logarithmic spiral antenna structure 100a of FIG. 2A with different incident angles @ ranging from 0° to 75° for TE mode. FIG. 10B shows a curve diagram of an absorption spectra of the augmented logarithmic spiral antenna structure 100a of FIG. 2A with different incident angles θ ranging from 0° to 75° for TM mode. FIG. 10C shows a curve diagram of an absorption spectra of the augmented logarithmic spiral antenna structure of FIG. 2A with different polarization angles φ ranging from 0° to 90° for TE mode. FIG. 10D shows a curve diagram of an absorption spectra of the augmented logarithmic spiral antenna structure 100a of FIG. 2A with different polarization angles φ ranging from 0° to 90° for TM mode.

In FIG. 10A and FIG. 10B, high absorption is maintained when the incident angle θ increases to 45°. Under TE mode, the spectral bandwidth reaches 95.6 THz in the frequency ranges from 4.5 THz to 100 THz with an absorption rate of more than 85.76%. For TE mode, the average absorption rate is up to 86.1% in the operating frequency band. The average absorption reaches 89.45% for TM mode in the same frequency ranges. It can be seen that the broadband absorption window is maintained up to 45° for both of TE and TM modes. The incident angle insensitivity of the augmented logarithmic spiral antenna structure 100a is due to the structural asymmetry of the hybrid logarithmic spiral structure. In addition, to demonstrate the polarization independent and wide-angle behaviors of the augmented logarithmic spiral antenna structure 100a, the influence of different polarization angles φ of the incident wave on the absorption spectra are shown in FIG. 10C and FIG. 10D. The figures depict that the simulated absorption spectra for TE and TM modes are polarization-insensitive over polarization angles φ ranges from 0° to 90°. It can be concluded that at φ=90, TE becomes TM and vice versa, Based on the above numerical results, it is obvious that the augmented logarithmic spiral antenna structure 100a can achieve ideal IR absorption in complex EM environments, and is polarization independent under both normal and oblique incidence of plane waves and maintained the absorption performance for both the TE and TM modes within the operation frequency band.

<Tests for Farfield Directivity and Gain>

The EM radiation pattern refers to the directional (angular) dependence of the strength of the EM waves from the antenna. It is defined as a mathematical function or a graphical representation of the far field radiation properties of the antenna, as a function of the direction of departure of the EM wave. The return loss (S11) is an important parameter in any EM antenna. However, there are other parameters such as directivity, gain and beam width, which play a big role and describe the performance of the antenna.

Figure 11A:
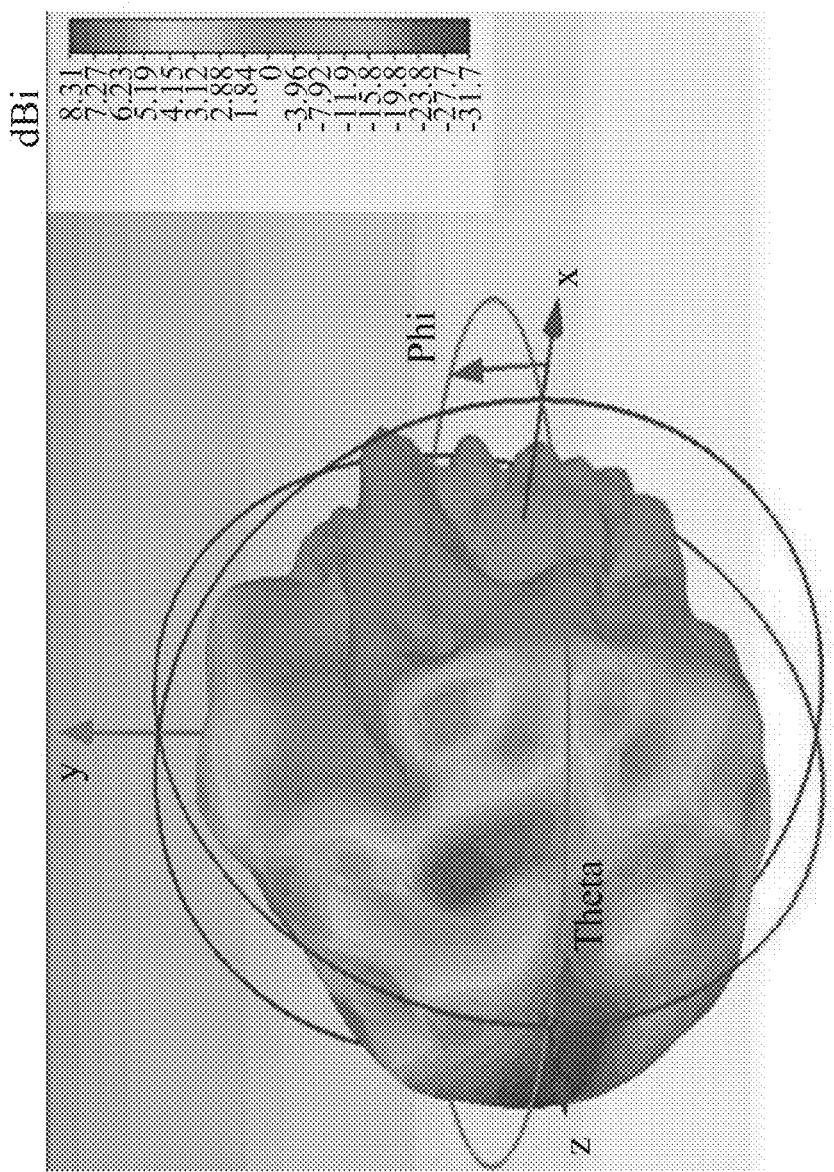
FIG. 11A shows a three-dimensional schematic view of a farfield directivity of the augmented logarithmic spiral antenna structure of FIG. 1A at 65.75 THz.
Figure 11B:
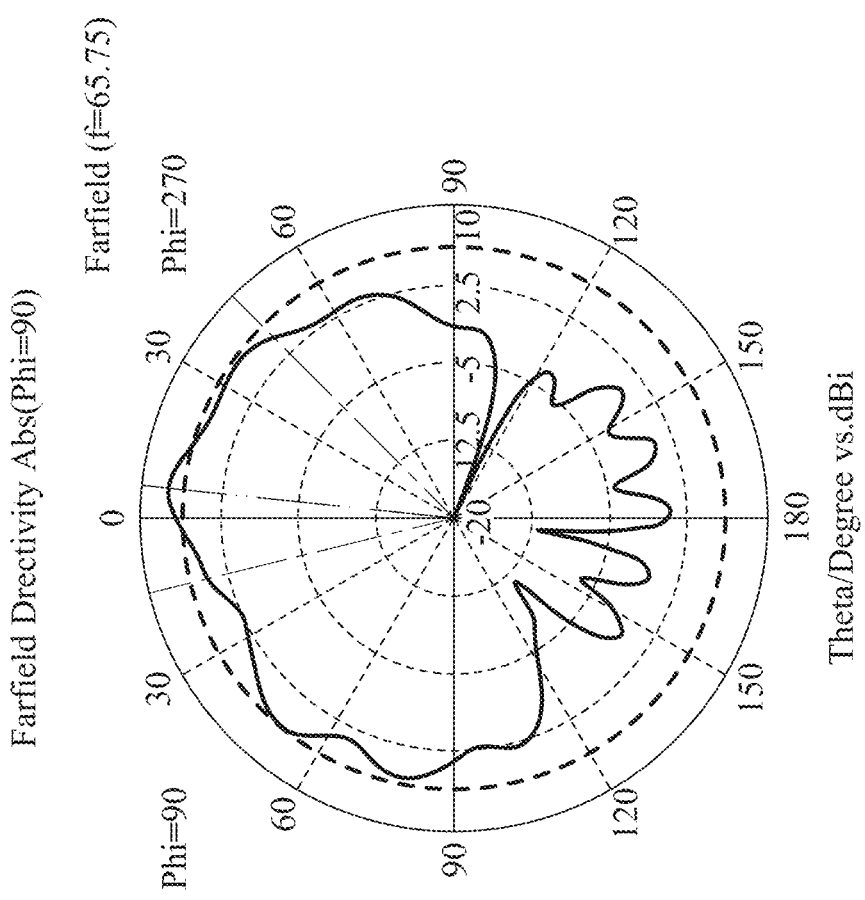
FIG. 11B shows a polar plot of the farfield directivity of the augmented logarithmic spiral antenna structure of FIG. 1A at 67.75 THz.

Please refer to FIG. 11A and FIG. 11B. FIG. 11A shows a three-dimensional (3D) schematic view of a farfield directivity of the augmented logarithmic spiral antenna structure 100 of FIG. 1A at 65.75 THz. FIG. 11B shows a polar plot of the farfield directivity of the augmented logarithmic spiral antenna structure 100 of FIG. 1A at 67.75 THz. As shown in FIG. 11A and FIG. 11B, it is observed that the peak directivity of the augmented logarithmic spiral antenna structure 100 can reach a value of 8.309 dBi at 65.75 THz, which is given by the 3D and polar plot view derived from the far field radiation pattern. The directivity in other direction is relatively lower than its value in the peak direction. The half power beam width of the augmented logarithmic spiral antenna structure 100 reaches 57.3 degree, over which the maximum EM energy was obtained by the antenna.

Figure 12A:
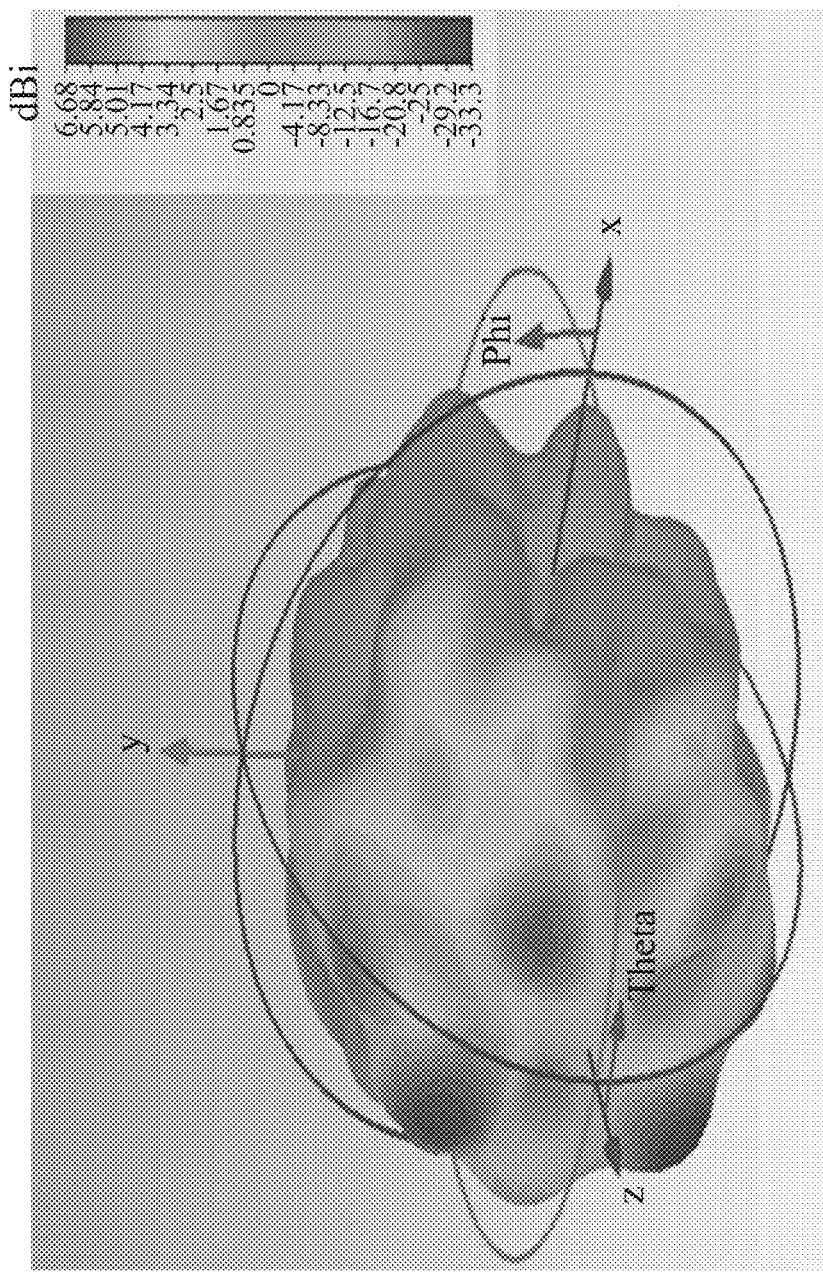
FIG. 12A shows a three-dimensional schematic view of a farfield directivity of the augmented logarithmic spiral antenna structure of FIG. 2A at 65.75 THz.
Figure 12B:
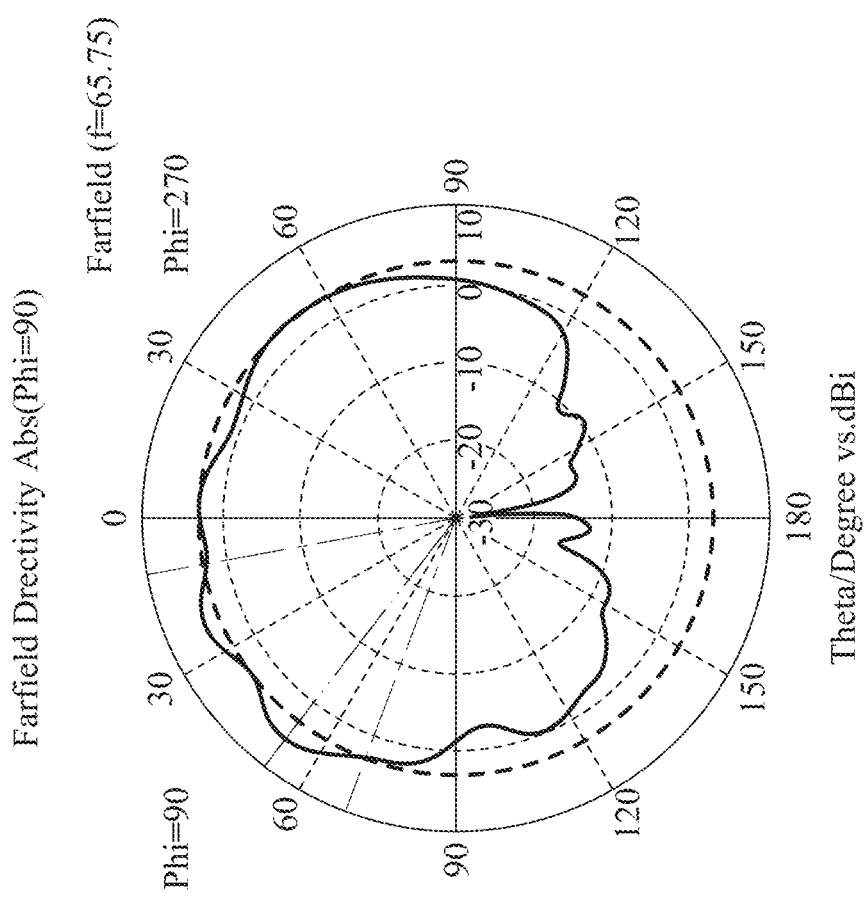
FIG. 12B shows a polar plot of the farfield directivity of the augmented logarithmic spiral antenna structure of FIG. 2A at 67.75 THz.

Please refer to FIG. 12A and FIG. 12B. FIG. 12A shows a three-dimensional schematic view of a farfield directivity of the augmented logarithmic spiral antenna structure 100a of FIG. 2A at 65.75 THz. FIG. 12B shows a polar plot of the farfield directivity of the augmented logarithmic spiral antenna structure 100a of FIG. 2A at 67.75 THz. As shown in FIG. 12A and FIG. 12B, it is observed that the peak directivity of the augmented logarithmic spiral antenna structure 100a can reach a value of 6.678 dBi at 65.75 THz. The half power beam width of the augmented logarithmic spiral antenna structure 100a reaches 59.2 degree. Thus, the augmented logarithmic spiral antenna structure 100a absorbs the EM energy efficiently from different directions implying the antenna is omnidirectional. This omnidirectional nature of the augmented logarithmic spiral antenna structure 100a is due to the geometrical asymmetry and the groove like asymmetric structure (i.e., the first pattern of the first conductive layer 200a and the second pattern of the dielectric layer 300a).

The other parameter that describes how well the antenna converts the receiving EM signal into electrical power known as antenna gain. It is the measure of how the radiated/received power concentrates in a particular direction. Generally, the antenna gain is closely associated to the antenna's directivity, but it is also a measure that takes into account the efficiency of the antenna.

Figure 13A:
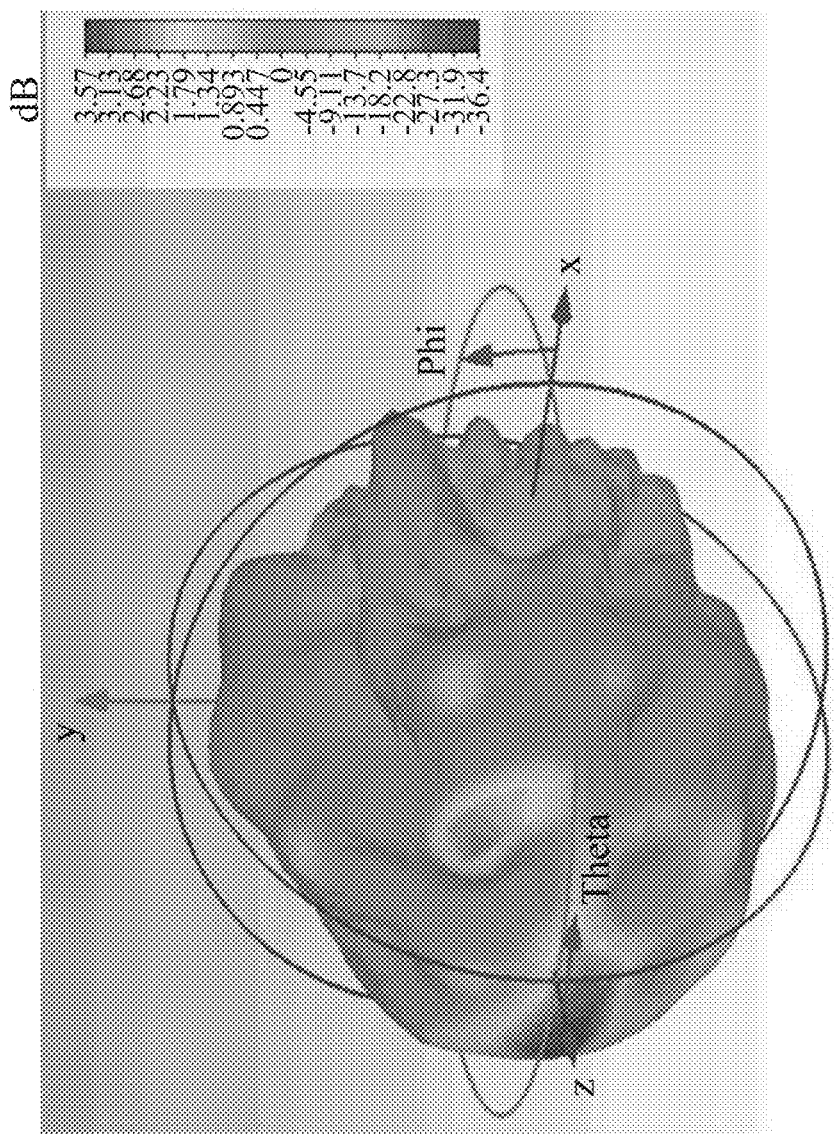
FIG. 13A shows a three-dimensional schematic view of a farfield gain of the augmented logarithmic spiral antenna structure of FIG. 1A at 65.75 THz.
Figure 13B:
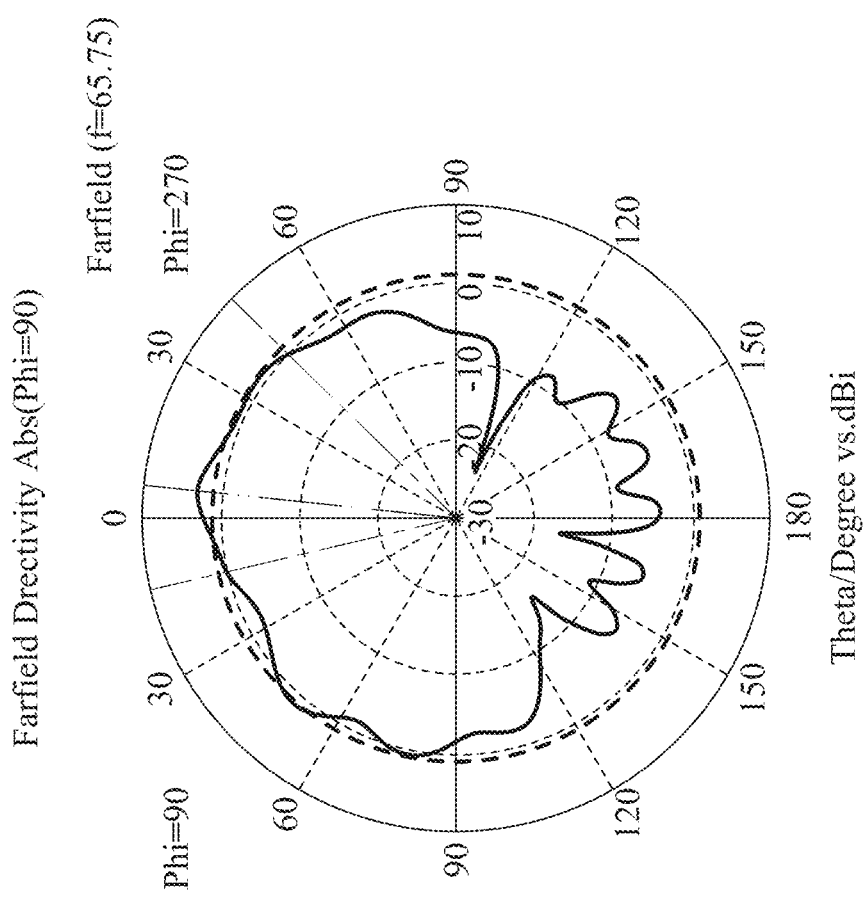
FIG. 13B shows a polar plot of the farfield gain of the augmented logarithmic spiral antenna structure of FIG. 1A at 67.75 THz.
Figure 14A:
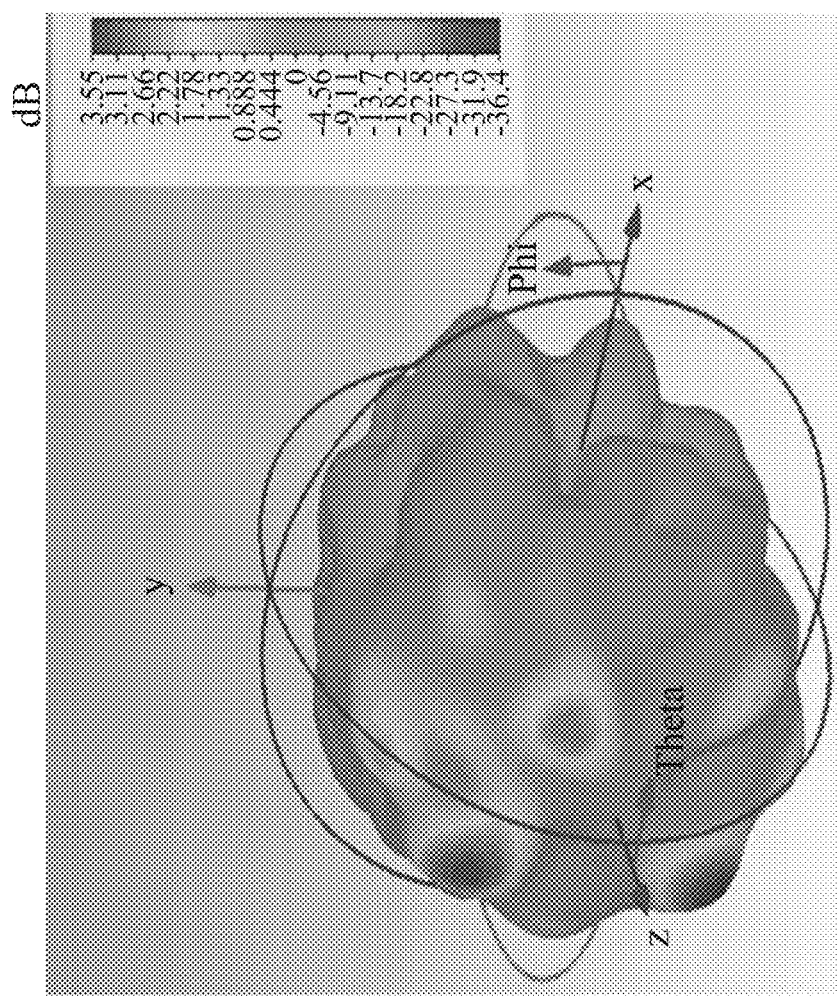
FIG. 14A shows a three-dimensional schematic view of a farfield gain of the augmented logarithmic spiral antenna structure of FIG. 2A at 65.75 THz.
Figure 14B:
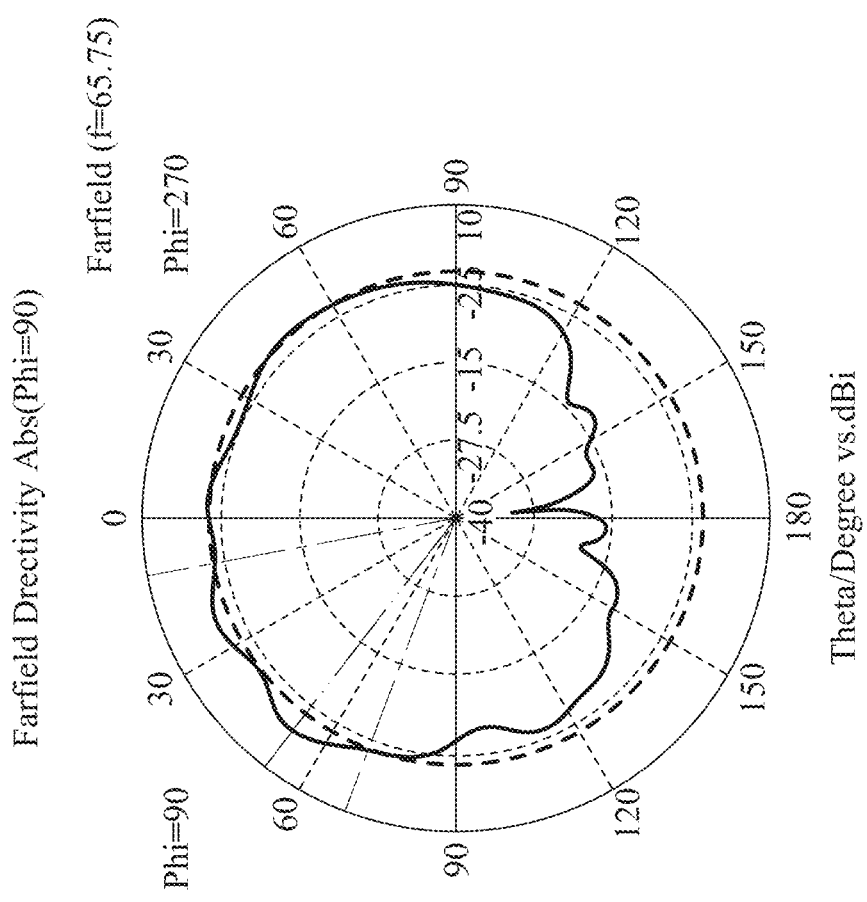
FIG. 14B shows a polar plot of the farfield gain of the augmented logarithmic spiral antenna structure of FIG. 2A at 67.75 THz.

Please refer to FIG. 13A, FIG. 13B, FIG. 14A and FIG. 14B. FIG. 13A shows a three-dimensional schematic view of a farfield gain of the augmented logarithmic spiral antenna structure 100 of FIG. 1A at 65.75 THz. FIG. 13B shows a polar plot of the farfield gain of the augmented logarithmic spiral antenna structure 100 of FIG. 1A at 67.75 THz. FIG. 14A shows a three-dimensional schematic view of a farfield gain of the augmented logarithmic spiral antenna structure 100a of FIG. 2A at 65.75 THz. FIG. 14B shows a polar plot of the farfield gain of the augmented logarithmic spiral antenna structure 100a of FIG. 2A at 67.75 THz. As shown in FIG. 13A, FIG. 13B, FIG. 14A and FIG. 14B, the farfield gains of the augmented logarithmic spiral antenna structure 100 and the augmented logarithmic spiral antenna structure 100a are 3.573 dB and 3.55 dB, respectively, at the operating frequency of 65.75 THz. The polar plot clearly shows that the augmented logarithmic spiral antenna structure 100a has a lesser gain than the augmented logarithmic spiral antenna structure 100. The lower gain of the augmented logarithmic spiral antenna structure 100a limits its practical application for far distance energy source. Therefore, in order to maximize the power received, the distance between the antenna and the EM power source should not be far apart. Due to the lower gain, the augmented logarithmic spiral antenna structure 100a is more non-directional and can receive energy from all direction.

In summary, the present disclosure has the following advantages. First, the augmented logarithmic spiral antenna structure of the present disclosure uses a planar gradient logarithmic spiral antenna with a metal insulator-metal (MIM) configuration to achieve a broadband response in the IR region. Second, through the hybrid logarithmic spiral structure, obtaining ultra-wide band absorption of an average of 88.5% in the frequency range from 4.5-100 THz. Third, the groove like asymmetric structure (i.e., both of the first conductive layer and the dielectric layer have the hybrid logarithmic spiral structure of the pattern) makes the augmented logarithmic spiral antenna structure insensitive to polarization (0° to 90°) and incident (0° to 45°) angles for both of TE and TM modes, and allows it to collect EM radiation from several directions.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An augmented logarithmic spiral antenna structure, comprising:
   a first conductive layer, comprising:
      a first spiral arm comprising a first initial radius; and
      a plurality of second spiral arms disposed around and connected to the first spiral arm, wherein each of the second spiral arms comprises a second initial radius;
   a dielectric layer having a top surface and a bottom surface, and the top surface is connected to the first conductive layer; and
   a second conductive layer connected to the bottom surface;
   wherein a plurality of the second initial radii of the second spiral arms are different from each other, and different from the first initial radius.

2. The augmented logarithmic spiral antenna structure of claim 1, wherein the first spiral arm further comprises a first inner curve radius, a first outer curve radius, a flare rate, an angular position and a phase shift between two consecutive curves of the first spiral arm, and a plurality of following equations are satisfied:

$$r_1 = r_o e^{a\phi};$$

$$r_2 = r_o e^{a(\phi+\delta)};$$

wherein $r_0$ is the first initial radius, $r_1$ is the first inner curve radius, $r_2$ is the first outer curve radius, a is the flare rate, $\phi$ is the angular position that varies from 0 to $3\pi$, and $\delta$ is the phase shift.

3. The augmented logarithmic spiral antenna structure of claim 2, wherein a flare rate and an angular position of each of the second spiral arms are the same as the flare rate and the angular position of the first spiral arm.

4. The augmented logarithmic spiral antenna structure of claim 1, wherein both of the dielectric layer and the second conductive layer are a continuous layer, the first conductive layer is laminated on the top surface of the dielectric layer, and the bottom surface of the dielectric layer is laminated on the second conductive layer.

5. The augmented logarithmic spiral antenna structure of claim 1, wherein the first conductive layer consists of a lossy metal, the dielectric layer consists of a highly insulated material, and the second conductive layer consists of another lossy metal;
wherein the lossy metal is nickel (Ni), the highly insulated material is SU-8 and has a relative permittivity of 2.8, and the another lossy metal is gold (Au).

6. The augmented logarithmic spiral antenna structure of claim 1, wherein a thickness of the first conductive layer is $Z_1$, a thickness of the dielectric layer is $Z_2$, a thickness of the second conductive layer is $Z_3$, and the following condition is satisfied:

$$Z_1 = Z_3 < Z_2.$$

7. The augmented logarithmic spiral antenna structure of claim 6, wherein the thickness of the first conductive layer is greater than a skin depth of the first conductive layer, the thickness of the dielectric layer is greater than a penetration depth of the dielectric layer, and the thickness of the second conductive layer is greater than a skin depth of the second conductive layer.

8. An electromagnetic wave energy absorber, comprising:
a nanoantenna comprising at least one augmented logarithmic spiral antenna structure of claim 1, wherein the nanoantenna is configured to absorb an incident radiation, and a frequency of the incident radiation is f, and the following condition is satisfied:

$$4.5\ THz < f \le 100\ THz.$$

9. The electromagnetic wave energy absorber of claim 8, wherein the incident radiation is incident on the nanoantenna in a normal direction, and the nanoantenna has an average absorption corresponding to the incident radiation, the average absorption is AA, and the following condition is satisfied:

$$88.5\% \le AA.$$

10. An augmented logarithmic spiral antenna structure, comprising:
a first conductive layer having a first pattern, and comprising:
a first spiral arm comprising a first initial radius; and
a plurality of second spiral arms disposed around and connected to the first spiral arm, wherein each of the second spiral arms comprises a second initial radius;
a dielectric layer connected to the first conductive layer and having a second pattern, wherein the second pattern is the same as the first pattern; and
a second conductive layer connected to the dielectric layer, wherein the dielectric layer is located between the first conductive layer and the second conductive layer;
wherein a plurality of the second initial radii of the second spiral arms are different from each other, and different from the first initial radius.

11. The augmented logarithmic spiral antenna structure of claim 10, wherein the first spiral arm further comprises a first inner curve radius, a first outer curve radius, a flare rate, an angular position and a phase shift between two consecutive curves of the first spiral arm, and a plurality of following equations are satisfied:

$$r_1 = r_o e^{a\phi};$$
$$r_2 = r_o e^{a(\phi+\delta)};$$

wherein $r_0$ is the first initial radius, $r_1$ is the first inner curve radius, $r_2$ is the first outer curve radius, a is the flare rate, $\phi$ is the angular position that varies from 0 to $3\pi$, and $\delta$ is the phase shift.

12. The augmented logarithmic spiral antenna structure of claim 11, wherein a flare rate and an angular position of each of the second spiral arms are the same as the flare rate and the angular position of the first spiral arm.

13. The augmented logarithmic spiral antenna structure of claim 10, wherein the second conductive layer is a continuous layer having a surface, the first conductive layer is laminated on the dielectric layer, the first pattern is aligned with the second pattern, and the dielectric layer is laminated on the surface of the second conductive layer.

14. The augmented logarithmic spiral antenna structure of claim 10, wherein the first conductive layer consists of a lossy metal, the dielectric layer consists of a highly insulated material, and the second conductive layer consists of another lossy metal;
wherein the lossy metal is nickel (Ni), the highly insulated material is SU-8 and has a relative permittivity of 2.8, and the another lossy metal is gold (Au).

15. The augmented logarithmic spiral antenna structure of claim 10, wherein a thickness of the first conductive layer is $Z_1$, a thickness of the dielectric layer is $Z_2$, a thickness of the second conductive layer is $Z_3$, and the following condition is satisfied:

$$Z_1 = Z_3 < Z_2.$$

16. The augmented logarithmic spiral antenna structure of claim 15, wherein the thickness of the first conductive layer is greater than a skin depth of the first conductive layer, the thickness of the dielectric layer is greater than a penetration depth of the dielectric layer, and the thickness of the second conductive layer is greater than a skin depth of the second conductive layer.

17. An electromagnetic wave energy absorber, comprising:
a nanoantenna comprising at least one augmented logarithmic spiral antenna structure of claim 10, wherein the nanoantenna is configured to absorb an incident radiation, and a frequency of the incident radiation is f, and the following condition is satisfied:

$$4.5 \text{ THz} < f \leq 100 \text{ THz}.$$

18. The electromagnetic wave energy absorber of claim 17, wherein the incident radiation is incident on the nanoantenna in a normal direction, and the nanoantenna has an average absorption corresponding to the incident radiation, the average absorption is AA, and the following condition is satisfied:

$$88.5\% \leq AA.$$

19. A photoconductive antenna, which is configured to replace one of a spiral antenna and a bow tie antenna, and the photoconductive antenna comprising:
   the first conductive layer of the augmented logarithmic spiral antenna structure of claim 10;
   a photo-absorbing semiconductor layer connected to the first conductive layer, wherein a structure of the photo-absorbing semiconductor layer is the same as a structure of the dielectric layer of the augmented logarithmic spiral antenna structure of claim 10; and
   the second conductive layer of the augmented logarithmic spiral antenna structure of claim 10 connected to the photo-absorbing semiconductor layer, wherein the photo-absorbing semiconductor layer is located between the first conductive layer and the second conductive layer.

20. An array antenna, comprising:
   a plurality of the augmented logarithmic spiral antenna structures of claim 10, wherein a plurality of the first conductive layers of the augmented logarithmic spiral antenna structures are arranged at intervals, a plurality of the dielectric layers of the augmented logarithmic spiral antenna structures are arranged at intervals, and a plurality of the second conductive layers of the augmented logarithmic spiral antenna structure are connected to each other or formed integrally.

21. The array antenna of claim 20, wherein a slot is located between each two of the augmented logarithmic spiral antenna structures and has a width, a plurality of the slots are connected to each other in a grillage type, and the width of each of the slots is the same.

22. A rectenna, which is used for a communication or an energy harvesting device, and the rectenna comprising:
   the augmented logarithmic spiral antenna structure of claim 10 receiving a radio frequency signal or a radiation; and
   a rectifier module electrically connected to the augmented logarithmic spiral antenna structure and converting the radio frequency signal or the radiation from an alternating current into a direct current.

* * * * *